(12) United States Patent
Potkonjak

(10) Patent No.: US 8,176,454 B2
(45) Date of Patent: May 8, 2012

(54) NON-INVASIVE TIMING CHARACTERIZATION OF INTEGRATED CIRCUITS USING SENSITIZABLE SIGNAL PATHS AND SPARSE EQUATIONS

(75) Inventor: Miodrag Potkonjak, Los Angeles, CA (US)

(73) Assignee: Empire Technology Development LLC, Wilmington, DE (US)

( * ) Notice: Subject to any disclaimer, the term of this patent is extended or adjusted under 35 U.S.C. 154(b) by 370 days.

(21) Appl. No.: 12/550,119

(22) Filed: Aug. 28, 2009

(65) Prior Publication Data

US 2011/0055781 A1    Mar. 3, 2011

(51) Int. Cl.
*G06F 17/50* (2006.01)
(52) U.S. Cl. ......... 716/108; 716/106; 716/113; 716/134
(58) Field of Classification Search .................. 716/106, 716/108, 113, 134
See application file for complete search history.

(56) References Cited

U.S. PATENT DOCUMENTS

| | | | | |
|---|---|---|---|---|
| 7,017,126 | B2 * | 3/2006 | Potkoniak et al. | ............ 716/106 |
| 7,467,359 | B2 * | 12/2008 | Potkonjak et al. | ............ 714/792 |
| 7,900,184 | B2 * | 3/2011 | Potkonjak et al. | ............ 716/136 |
| 2010/0308895 | A1 | 12/2010 | Koushanfar et al. | |
| 2011/0041115 | A1 | 2/2011 | Potkonjak | |

OTHER PUBLICATIONS

Alkabani, Y et al., "Input vector control for post-silicon leakage current minimization in the presence of manufacturing variability," 45th Design Automation Conference, Jun. 8, 2008, pp. 606-609.
Dabiri, F. et al., "Hardware aging-based software metering," Design, Automation and Test in Europe, Apr. 20, 2009, pp. 460-465.
Nelson, M. et al., "SVD-Based Ghost Circuitry Detection," 11th Information Hiding, Jun. 7, 2009, pp. 221-234.
Beckmann, N. et al., "Hardware-Based Public-Key Cryptography with Public Physically Unclonable Functions," 11th Information Hiding, Jun. 7, 2009, pp. 206-220.
Potkonjak, M. et al., "Hardware Trojan horse detection using gate-level characterization," 46th Design Automation Conference, Jul. 26, 2009, pp. 688-693.
Wei, S. et al., "Gate-level characterization: foundations and hardware security applications," 47th Design Automation Conference, Jun. 13, 2010, pp. 222-227.
Vahdatpour, A. et al., "Leakage Minimization Using Self Sensing and Thermal Management," International Symposium on Low Power Electronics and Design, Aug. 18, 2010, pp. 265-270.

(Continued)

*Primary Examiner* — Sun Lin
(74) *Attorney, Agent, or Firm* — Schwabe, Williamson & Wyatt, P.C.

(57) ABSTRACT

Techniques for non-invasive, post-silicon characterization of signal propagation delay/timing of devices in an integrated circuit (IC) are generally disclosed. A system of equations may be developed based on a plurality of sensitizable signal paths (SSPs) of the IC for characterizing signal propagation delay or timing of devices within the SSPs. Input Vectors (IVs) may be selected and consecutively applied at one or more input sequential element devices of the IC associated with the SSPs with to produce corresponding output values at one or more output sequential element devices of the IC associated with the SSPs. Various pre-processing and post-processing techniques may be practiced to further improve accuracy of solution of the equations to enable efficient determination of solutions. Example techniques may include variable splitting, device clustering, IV and equation selection, and boosting, among others. Other aspects may also be disclosed and claimed.

32 Claims, 10 Drawing Sheets

OTHER PUBLICATIONS

Wei, S. et al., "Scalable Segmentation-Based Malicious Circuitry Detection and Diagnosis," International Conference on Computer-Aided Design, Nov. 7, 2010, pp. 483-486.

Koushanfar, F. et al., "Post-silicon timing characterization by compressed sensing," International Conference on Computer-Aided Design, Nov. 10, 2008, pp. 185-189.

Li, X. et al., "Virtual probe: a statistically optimal framework for minimum-cost silicon characterization of nanoscale integrated circuits," International Conference on Computer-Aided Design, Nov. 2, 2009, pp. 433-440.

Zhang, W. et al., "Bayesian virtual probe: minimizing variation characterization cost for nanoscale IC technologies via Bayesian inference," 47th Design Automation Conference, Jun. 13, 2010, pp. 262-267.

Shamsi, D. et al., "Noninvasive leakage power tomography of integrated circuits by compressive sensing," International Symposium on Low Power Electronics and Design, Aug. 11, 2008, pp. 341-346.

Meguerdichian, S. et al., "Device Aging-Based Physically Unclonable Functions," Design Automation Conference, Jun. 5, 2011, 2 pages.

Potkonjak, M. et al., "Differential Public Physically Unclonable Functions: Architecture and Applications," Design Automation Conference, Jun. 5, 2011, 6 pages.

Wei, S. et al., "Integrated Circuit Security Techniques Using Variable Supply Voltage," 48th Design Automation Conference, Jun. 5, 2011, pp. 248-253.

Abdollahi, A. et al., "Leakage current reduction in CMOS VLSI circuits by input vector control," IEEE Trans. VLSI, 12(2):140-154, 2004.

Alkabani, Y. et al., "Active hardware metering for intellectual property protection and security." In USENIX Security, pp. 291-306, 2007.

Chandrakasan, A. et al., "Optimizing power using transformations." IEEE Trans. on CAD, 14(1):12-31, 1995.

Hong, D. et al., "Power Optimization of Variable Voltage Core-based Systems", IEEE Transaction on CAD, vol. 18, No. 12, pp. 1702-1714, Dec. 1999.

Chang, H. et al., "Full-chip analysis of leakage power under process variations, including spatial correlations." In DAC, pp. 523-528, 2005.

Mukhopadhyay, S. et al., "Accurate estimation of total leakage in nanometer-scale bulk CMOS circuits based on device geometry and doping profile." IEEE Trans. on CAD, 24(3):363-381, 2005.

Yuan, L. et al., "A combined gate replacement and input vector control approach for leakage current reduction. IEEE Trans." on VLSI, 14(2):173-182, 2006.

Wei, S. et al., "Scalable Hardware Trojan Diagnosis", accepted for publication, IEEE Transactions on Very Large Scale Integration (VLSI) Systems, 2011.

Wei, S. et al., "Malicious Circuitry Detection Using Thermal Conditioning", accepted for publication, IEEE Transactions on Information Forensics and Security, 2011.

Vahdatpour, A. et al., "A Gate-Level Sensor Network for Integrated Circuits Temperature Monitoring", IEEE Sensors, pp. 625-655, 2010.

Meguerdichian, S. et al., "Matched Public PUF: Ultra Low Energy Security Platform", International Symposium on Low Power Electronics and Design, accepted for publication, Aug. 2011.

Wei, S. et al., "Scalable Consistency-based Hardware Trojan Detection and Diagnosis", The 5th International Conference on Network and System Security, accepted for publication, Sep. 2011.

Wei, S. et al., "Integrated Circuit Digital Rights Management Techniques Using Physical Level Characterization", ACM Workshop on Digital Rights Management 2011, accepted for publication, Oct. 2011.

Restriction Requirement, issued in U.S. Appl. No. 12/541,098, mailed Dec. 2, 2011, 5 pages.

* cited by examiner

Computing Program Product 801

Signal Bearing Medium 803

805
One or more instructions to:

- cause the apparatus to determine a system of signal propagation delay equations for the gates within IC 204;

- cause the apparatus to preprocess the system of equations according to a number of techniques such as grouping devices (e.g. gates), splitting variables, selecting equations, and selecting input-output terminals, among others, as described above, to make the measurements more accurate and the equations sparser and suitable for use with compressive sensing; and/or

- cause the apparatus to post-process the results of solving the signal propagation delay equations.

| 807<br>A computer readable medium | 809<br>A recordable medium | 811<br>A communications medium |
|---|---|---|

Fig. 8

NON-INVASIVE TIMING CHARACTERIZATION OF INTEGRATED CIRCUITS USING SENSITIZABLE SIGNAL PATHS AND SPARSE EQUATIONS

CROSS REFERENCES

This application is technically related to U.S. application Ser. No. 12/541,098 entitled "NON-INVASIVE LEAKAGE POWER CHARACTERIZATION OF DEVICES OF INTEGRATED CIRCUITS USING DEVICE GROUPING AND SPARSE EQUATIONS," filed Aug. 13, 2009.

BACKGROUND

Modern integrated circuits have become very complex due to continuous Complementary Metal Oxide Semiconductor (CMOS) scaling that has made possible integration of billions of transistors into a single multi-layer chip. Scaling to the physical device limitations and mask imprecision may have created non-determinism in the chip's characteristics, such as signal propagation delay or timing. In this environment, traditional timing characterization models and/or test methods may have limited effectiveness.

Gate-level, timing measurement and characterization may be important in many designs, run time management, and testing tasks. Manufacturing variability and operational and environmental conditions in post-silicon integrated Circuits (IC) may render timing characteristics of gate-level devices such as logic gates, transmission gates, switches, and so forth, unpredictable and/or unknown. Furthermore, with miniaturization of devices beyond 65 nm (nano-meter), the impact of intra-die variation and the spatial correlations have become more prominent. Several key areas may have been impacted. For example, the number of critical paths may be increasing with variation, rendering the traditional test methodologies based on a few critical paths inexpressive.

In statistical static timing analysis (SSTA), instead of the single valued delays utilized in traditional timing characterization models, the delay probability distributions and their correlations may be used. SSTA produces pre-silicon (i.e., pre-manufacturing) models and analysis. Recently proposed methods for IC timing measurement include post-silicon timing analysis of the ICs that integrates the SSTA models with data collected from a few on-chip test points (e.g., via ring oscillators), to estimate the chip-specific distribution of the delays. However, like other traditional timing characterization methods, the technique may be limited by the large size of modern integrated circuits, as well as MV, and operational and environmental conditions.

BRIEF DESCRIPTION OF THE DRAWINGS

Subject matter is particularly pointed out and distinctly claimed in the concluding portion of the specification. The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings. Various embodiments will be described referencing the accompanying drawings in which like references denote similar elements, and in which:

FIG. 8 is a diagram showing an example article of manufacture including a computing program product.

DETAILED DESCRIPTION OF ILLUSTRATIVE EMBODIMENTS

Figure 1:
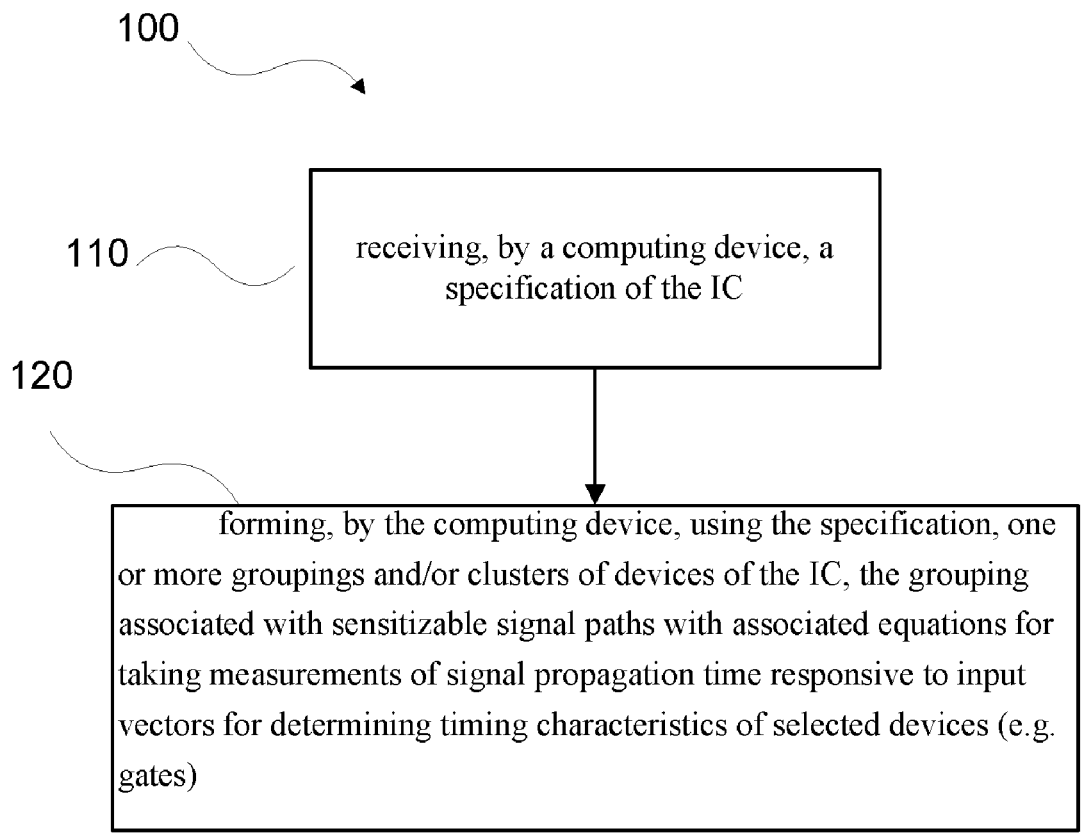
FIG. 1 is a flowchart of an illustrative method for timing characterization of an IC including grouping and/or clustering of devices.

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter. In the following detailed description, reference is made to the accompanying drawings, which form a part hereof In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, may be arranged, substituted, combined, and designed in a wide variety of different configurations, all of which are explicitly contemplated and make part of this disclosure.

In the following description, algorithms and/or symbolic representations of operations on data bits and/or binary digital signals stored within a computing system, such as within a computer and/or computing system memory may be presented. An algorithm is generally considered to be a self-consistent sequence of operations and/or similar processing leading to a desired result where the operations may involve physical manipulations of physical quantities that may take the form of electrical, magnetic and/or electromagnetic signals capable of being stored, transferred, combined, compared and/or otherwise manipulated. In various contexts such signals may be referred to as bits, data, values, elements, symbols, characters, terms, numbers, numerals, etc. Those skilled in the art will recognize, however, that such terms may be used to connote physical quantities. Hence, when terms such as "storing", "processing", "retrieving", "calculating", "determining" etc. are used in this description they may refer to the actions of a computing platform, such as a computer or a similar electronic computing device such as a cellular telephone, that manipulates and/or transforms data represented as physical quantities including electronic and/or magnetic quantities within the computing platform's processors, memories, registers, etc.

This disclosure is drawn, inter alias to methods, apparatus, systems and computer program products related to characterizing signal propagation delay and/or timing of ICs.

Overview of Illustrative Methods

Economically and practically feasible non-invasive and/or nondestructive measurement techniques for characterization of various IC parameters, including signal propagation delay or timing, may be desirable for today's large IC which may have billions of transistors, and/or silicon features that may be 65 nm or smaller. A fast, robust, non-invasive, non-destructive, post-silicon method, based on sensitizable signal paths (SSPs) and compressive sensing, for signal propagation delay or timing measurement and characterization that may be suitable for use in such large ICs, is disclosed. In various embodiments, example methods may include determining a system of accurately solvable signal propagation delay or timing equations for modeling devices within the IC. Pre-processing and/or post-processing techniques may be employed to improve accuracy of solution of the system of signal propagation delay or timing equations, which may increase the likelihood and may reduce the complexity of solving the equations. Pre-processing may including grouping and/or clustering of devices (e.g. gates), splitting variables, selecting equations, and/or using multiple approximation grids, among others. Post-processing may include performing multiple runs of measurements and/or conducting learn and test procedure, among others. Input vectors (IV) may be selected for application to input sequential element devices of the IC associated with the SSPs. Timing responses at output sequential element devices of the IC associated with the SSPs may be measured. The measurements may be employed to solve the system of signal propagation delay and/or timing equations to characterize signal propagation delay and/or timing of the devices. Compressive sensing techniques may be used to solve the set of equations.

FIG. 1 is a flowchart of an illustrative method 100 for characterizing timing of devices of an IC including grouping and/or clustering of devices, in accordance with various embodiments of the present disclosure. The example method 100 may include one or more processing operations, functions or actions as illustrated by blocks 110 and/or 120, which may be performed by a computing device (not shown in FIG. 1). Processing for method 100 may begin at block 110.

At block 110 ("receiving, by a computing device, a specification of the IC") a specification of an integrated circuit (IC), for example, a specification file that may including a device level (e.g. gate-level or transistor level) specification of sequential element and combinatorial devices and related interconnects of the IC, may be provided to a computing device. In some embodiments, the specification of the devices may be in the form of a Hardware Description Language (HDL), such as VHDL or Verilog©. Other formats and methods may also be used to represent hardware description, such as using a netlist (showing connectivity of circuit elements for CAD (Computer Aided Design) programs), MATLAB©, RTL (Register Transfer Language), SPICE (Simulation Program with Integrated Circuit Emphasis), XML (eXtensibile Markup Language used for data definition/representation), or general programming languages such as C++ and C#. Block 110 may be followed by block 120.

At block 120 ("forming, by the computing device, one or more groupings and/or clusters of devices of the IC, the groupings associated with sensitizable signal paths with associated equations for taking measurements of signal propagation time responsive to input vectors for determining timing characteristics of the devices (e.g. gates)"), using the computing device, the specification of the devices within the IC may be used to define or form a number of groupings of the devices of the IC, each grouping of devices associated with one of the Sensitizable Signal Paths (SSP) of the IC. A SSP in an IC may be defined as a sequence of devices, including interconnected sequential element devices. A device may include for example, logic gates, transmission gates, switches, transistors, diodes, inductors, capacitors, resistors, and so forth. A SSP may be determined by using transistive fan-in technique following the outputs of successive devices. To ascertain the propagation delay of the paths, appropriate pairs of input vectors, which may be defined as particular combinations of input values applied to input sequential element devices of the paths to produce output values at output sequential element devices of the paths, may be determined. If an input vector exists for a path, the path may be called sensitizable; otherwise, it may be called unsensitizable. SSPs may not be unique and may depend on one or more input values (or input vectors) applied at one or more correspondingly associated input sequential element device of the SSP. Additionally, in some embodiments, SSPs may pass through a combinatorial logic circuit including one or more combinatorial devices. An output of a sequential logic circuit depends both on input values to the sequential logic circuit and the previous input values, for example, in a clocked circuit. A system of equations based on such SSPs may be derived for modeling signal propagation delay or timing through various devices of the SSPs of the IC. In summary, a sensitizable signal path may comprise one or more digital and/or analog elements (sequential or combinatorial).

Pre-processing techniques may be used to make such system of equations more solvable with improved accuracy, to increase the likelihood and/or reducing the complexity in solving the equations. Accuracy of the solution of a set of equations may be improved by improving one or more characteristics of the set of equations, including but not limited to, for examples, increasing the number of equations for a given number of variables, decreasing or having no variables that are combinations of other variables, decreasing or having no equations that are linearly dependent, increasing the number of variables that are in multiple equations, and/or increasing the number of coefficients of the variables that are similar.

It is to be understood that signal propagation delay and/or signal timing may sometimes be used interchangeably with one another. Moreover, signal propagation delay may also be characterized as a signal speed or signal bandwidth. Accordingly, in the rest of this disclosure the terms "signal propagation delay" and "signal timing" (or simply, "timing") or "signal speed" or "signal bandwidth" may be used interchangeably unless specifically differentiated. Furthermore, the terms "input" and "input vector" may also be used interchangeable, unless specifically differentiated.

Various embodiments of method 100 will be further described below with reference to FIGS. 2-7. In particular, various embodiments that may employ device characterization of the signal propagation delay or timing of the ICs will be described. Briefly, as an overview, for some of these embodiments, device characterizations of signal propagation delay or timing may first be performed for one or more ICs that implement the same circuit design but that may differ from each other due to manufacturing variability. The device characterizations of signal propagation delay or timing may represent the effects of manufacturing variability on the signal propagation delay in each IC. Next, N instances of the ICs that each model the device characterizations of signal propagation delay or timing may be selected (or generated for embodiments employing software equivalent instances of the IC) such that each of the N instances of the ICs may also represent the effects of manufacturing variability on their respective signal propagation delay or timing. The input-output sequential element device pairs and/or input values that make a significant number of coefficients in the signal propagation delay modeling equations similar may be selected. By applying the selected input vectors to input sequential element devices of the IC and taking measurements of when the resulting outputs are latched in the output sequential element devices of the IC, the equations may then be solved, using the computing device (and optionally compressive sensing techniques), to determine the signal propagation delay or timing characteristic of the devices of the SSPs of the IC.

Some embodiments may provide an article of manufacture that comprises a tangible computer-readable medium, such as a memory or other physical storage device, having stored thereon, computer-executable instructions that when executed by a computing device may cause the computing device to perform at least some of the operations of method 100, and/or operations of the embodiments described referencing FIGS. 2-7. An example embodiment of such a computer-readable medium will be further described below with references to FIG. 8, and an example of such a computing device may include the test apparatus 402 of FIG. 4, which will be described further below with reference to FIG. 9.

In some embodiments, as an IC ages, the device characterization of signal propagation delay or timing can be repeated so as to find other inputs or input vectors to enable the characterization, as the signal propagation delay or timing of certain devices (such as highly used gates, for example) may increase over time.

Before further describing embodiments of the present disclosure, it should be noted that some embodiments may address at least two major challenges so as to provide an efficient technique for selecting inputs to characterize signal propagation delay or timing of a plurality of ICs having the same design but differ in manufacturing variability. When device characterization is employed, the first challenge addressed by some embodiments is the extraction of the device characteristics of an IC by measuring the output signal delay for different inputs applied at various input terminals of the ICs. The second challenge that may be addressed by some embodiments is the rapid generation of inputs that may result in sparse signal propagation delay modeling equations. As will be appreciated from the descriptions to follow, some embodiments of the present disclosure attempt to effectively address these and other challenges.

Illustrative Device Including an IC Having Manufacturing Variability

Figure 2:
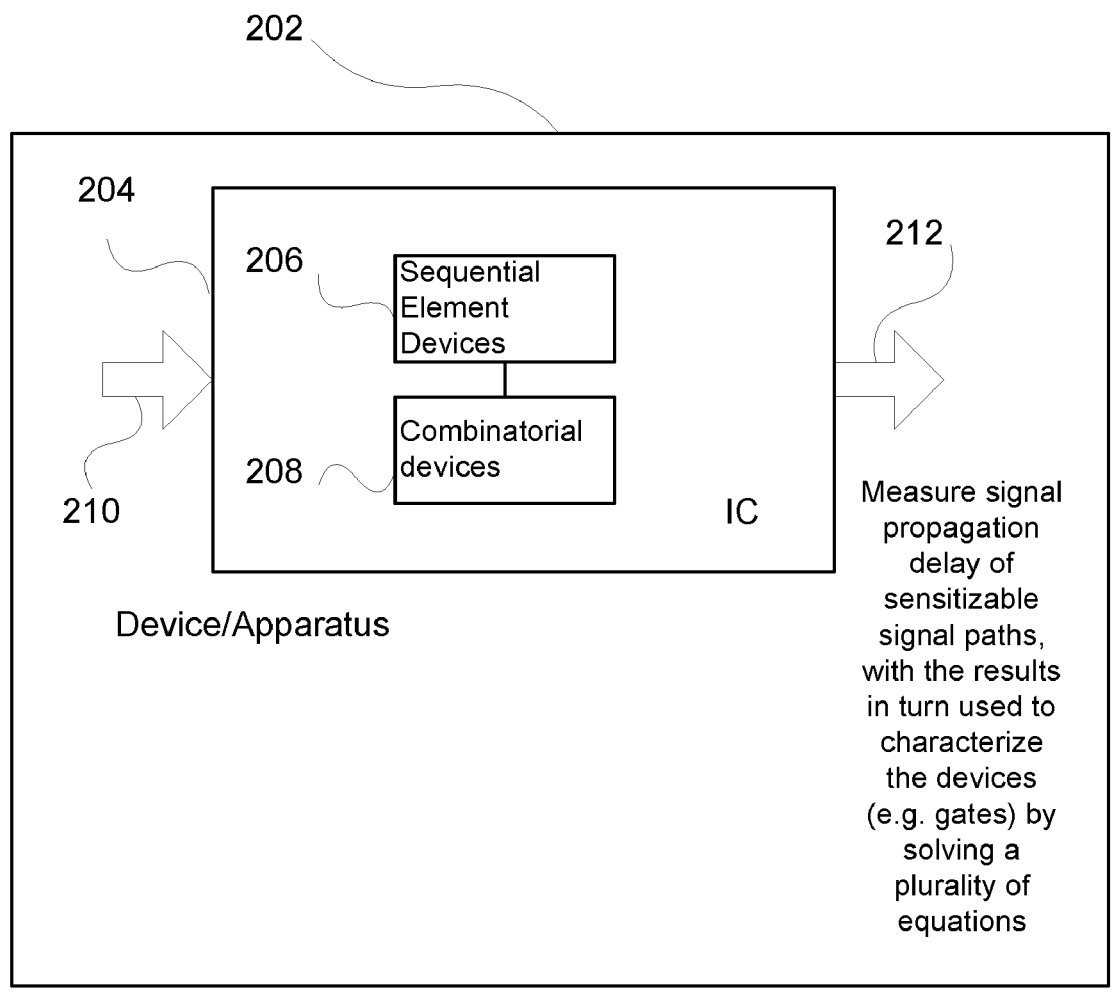
FIG. 2 is a block diagram of an example apparatus that includes an IC.

FIG. 2 is a block diagram of an example apparatus 202 that includes an integrated circuit (IC) 204, which may be suitable for practicing various embodiments of the present disclosure. The apparatus 202 may include, for instance, a cellular telephone, a laptop computer, a desktop computer, a network device (such as a server), or any other type of stationary or mobile electronic apparatus.

IC 204 of some embodiments may include at least one input terminal 210 and at least one output terminal 106. IC 204, for the illustrated example, may include a number of sequential element devices 206 and a number of combinatorial element devices 208. The devices 206 and 208 may be selectively interconnected to implement an integrated circuit design (e.g., a microprocessor). As will be explained in further detail below, in some embodiments, an input may be applied to one input terminal or to a plurality of the input terminals of sequential element devices 260 associated with SSPs, and the resulting output signal delay or timing may be measured or otherwise determined for the SSPs when the results are latched at one or a plurality of other sequential element devices 206 associated with the SSP, with the results in turn used to characterize the signal propagation delay or timing of the devices of the IC by solving a plurality of equations associated with SSP of the IC, using e.g., compressive sensing techniques. As will be described in more detail below, in various embodiments, the accuracy of the solution of the equations may be improved by clustering of devices associated with the SSPs. In other embodiments, the accuracy of the solution of the equations may be further improved through pre-processing and post-processing techniques, to be described more fully below.

For the sake of simplicity of explanation herein, the various combinatorial devices 208 be described in the context of "gates" when describing techniques pertaining to the characterization of the effects of manufacturing variability (MV) on signal propagation delay or timing. However the description is not be construed as limiting on the invention. As described earlier, both digital and/or analog elements, sequential or combinatorial, as well as interconnect, may be characterized using techniques disclosed herein.

IC 204 may have intrinsic MV that may result from the manufacturing process. One or both of two types of MV may be present in the IC 204: i) inter-die variations (denoted by $\delta_{inter}$) that may include die-to-die fluctuations (e.g. variations between IC 204 and another IC that implements the same circuit design); and (ii) intra-die variations (denoted by $\delta_{intra}$) that may include the fluctuations present inside the single IC 204. It may be assumed that inter-die variations may similarly affect all the gates 206 on the single IC 204, while the intra-die variations may differently influence various ICs. The MV may generally represent that the variations may not be explicitly part of the circuit design and further may fluctuate within the IC 204 and/or between multiple ICs 204 that implement the same circuit design.

Variation and Delay Model

As noted above, process variation may generally be categorized as intra-die and/or inter-die. The inter-die variation may represent the variation among different dies in the same wafer. The intra-die variation may refer to the variation among different devices on the same chip. Since the inter-die variation may be constant over a specific chip, some embodiments of the present disclosure may be focused on inter-die variation. The intra-die variation may be modeled as an uncorrelated random variable and a spatially correlated random variable, both modeled as Gaussian or normally distributed.

Figure 3:
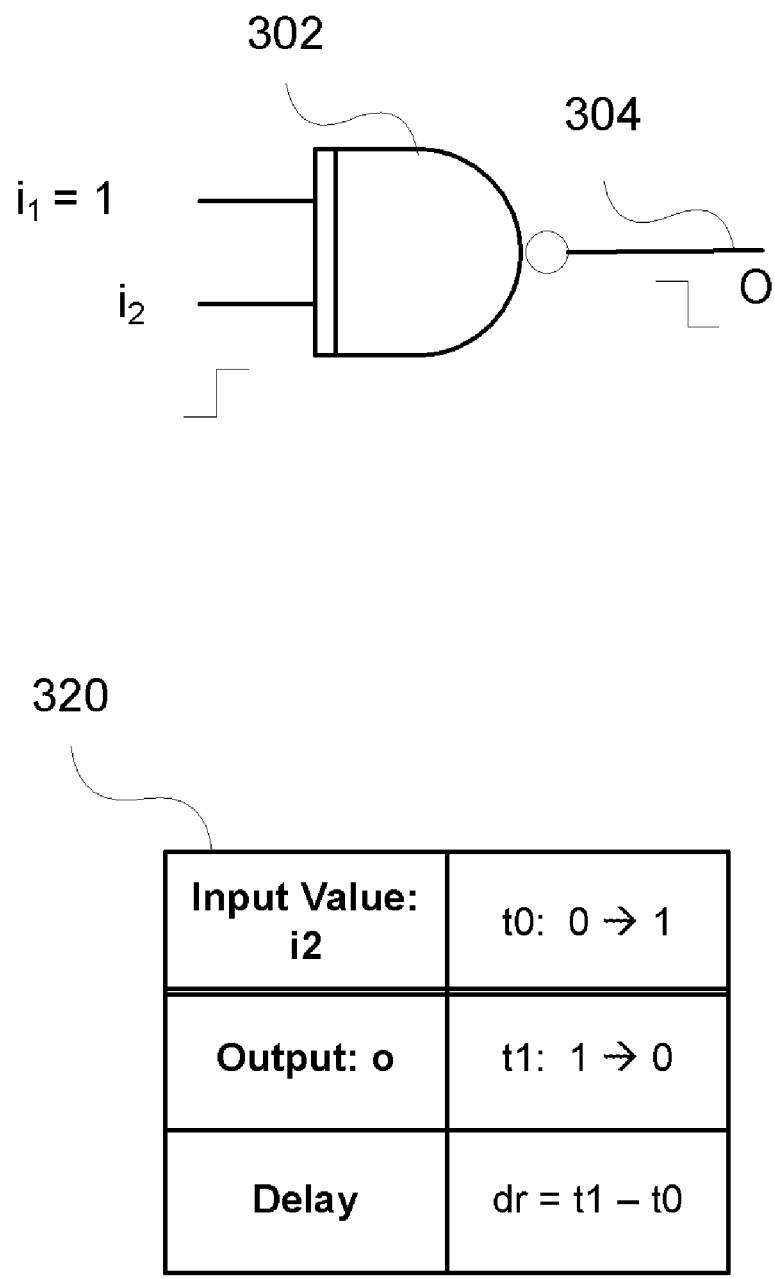
FIG. 3 is a schematic diagram of an example circuit illustrating the potential impact of manufacturing variability (MV) on device timing in response to application of a new input.

Specifically, the Normal random variables may describe variation of the devices' dimensions. Transition delay may be reasonably modeled as a linear function of transistor feature size variation. FIG. 3 is a schematic diagram of an example circuit illustrating the potential impact of manufacturing variability (MV) on device (or gate) timing in response to application of a new input, in accordance with various embodiments of the present disclosure. As an example device, consider example NAND logic gate 302 where one of its inputs $i_1=1$ (logic-1) and where its other input $i_2$ at time t0=0, transitions from 0 (logic-0) to 1 (logic-1 shown in Table 320. Because of propagation delay of example NAND gate 302, output o transitions from 1 to 0 at time t2=dr. When there are variations in the transistor feature size, the signal rising-edge delay, denoted by dr (=t1−t0), may vary among different NAND gates having the same design as example NAND gate 302 in the IC, as modeled by:

$$dr(\psi^{total}) = dr^0 + \xi \psi_u^{total} \qquad (1)$$

where $\xi$ is a constant, $\psi_u^{total}$ is total delay variation (sum of inter-die and intra-die variations), and $dr^0$ is the nominal or standard delay for the particular type and design of the NAND gate (for example, NAND gate 302.) The signal falling edge (transitioning from logic-0 to logic-1), denoted by df, may be generally different from dr, and may be represented in a manner similar to Equation (1).

It is noteworthy that even if the signal propagation delay or timing is modeled as a quadratic (or higher order) polynomial rather than linear, a similar approach may be used by assuming new variables for the higher order parameters.

Impact of Manufacturing Variability

As noted above, a circuit including example NAND gate 302 of FIG. 3 may include many other NAND gates of the same type and design. However, each of these NAND gates may generally have different signal propagation delay or timing characteristics due to MV. The signal propagation delay or timing of the same type of device may, in some examples, vary between 10% to 100% or more of the nominal value. Thus, MV considerations may play a role in determining the optimum inputs or input vectors for signal propagation delay or timing characterization and determination of signal propagation delay or timing modeling equations for each IC.

Some embodiments may employ statistical (clustering) and optimization techniques that may include linear programming (LP), and/or integer linear programming (ILP). Clustering is a non-supervised statistical procedure that may identify the topological structure of the data by partitioning it into classes with instances that have similar properties. LP may provide provably optimal polynomial solutions to problems with linear objective function and linear constraints. ILP may address the same problem under the additional constraint that all or a subset of variables may be integers.

Use of Test Apparatus

Figure 4:
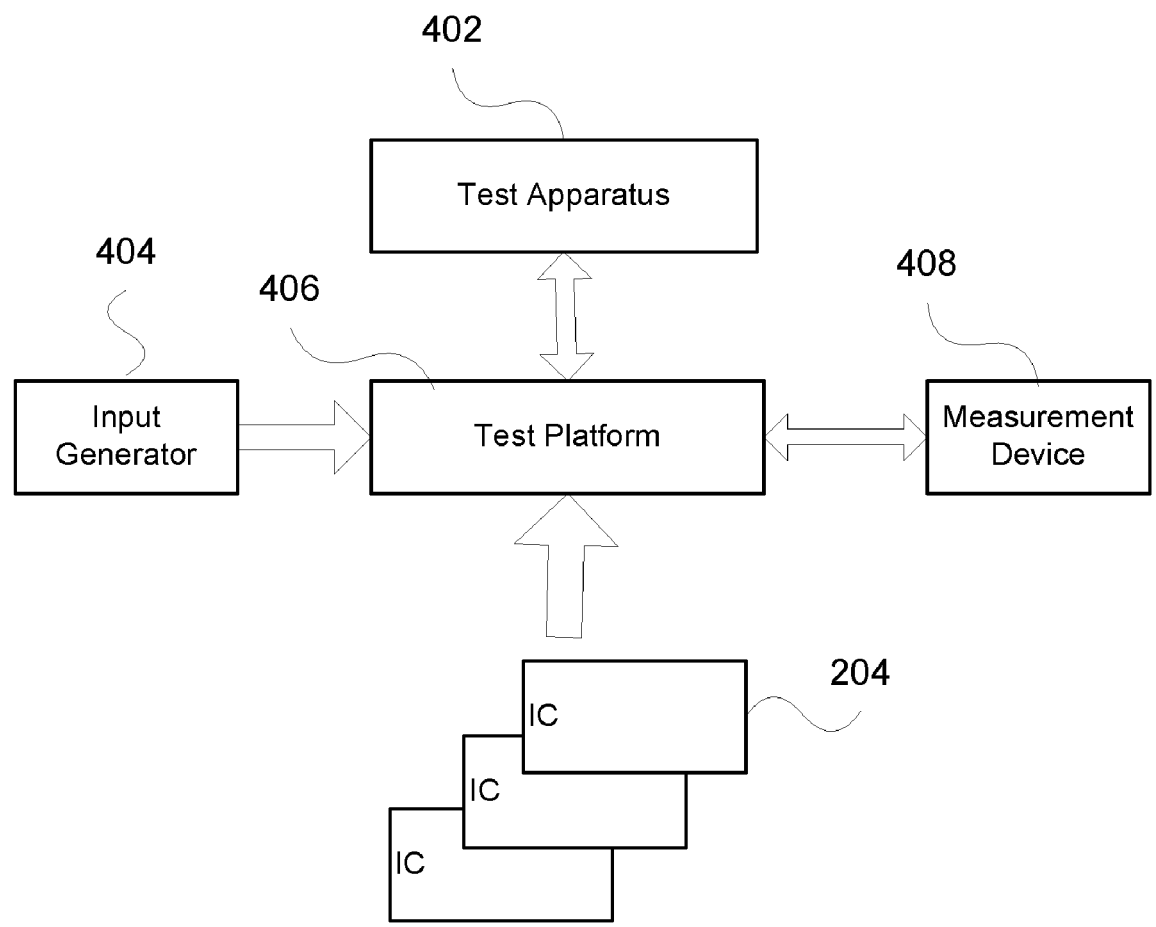
FIG. 4 is a block diagram showing an illustrative test apparatus to practice various embodiments.

FIG. 4 is a block diagram illustrating the use of a test apparatus 402 to practice various embodiments of the present disclosure. Examples of techniques that can be used by the test apparatus 402 to perform device characterization and to determine Inputs that may reduce or minimize signal propagation delay or timing for devices of ICs 204 will be shown and described later below. In some embodiments, the test apparatus 402 may be implemented as a computing device, such as the computing device 900 that will be described with respect to FIG. 9.

Test apparatus 402 may include and/or be coupled to one or more of a test platform 406, an input generator 404, and/or at least one measurement device 408. For the sake of clarity and simplicity of explanation hereinafter, test platform 406, the input generator 404, and measurement device 408 are depicted in FIG. 4 as being separate from the test apparatus 402. However, in some embodiments, one or more of the test platform 406, input generator 404, and/or measurement device 408 and/or their functionality may be integrated within test apparatus 402.

Test apparatus 402 may be located at a manufacturing facility, test facility, or some other location where device characterization may be performed and/or where Inputs to minimize and/or reduce signal propagation delay or timing for devices of each IC 204 to a desired level may be determined. For example in an industrial setting, the test apparatus may be located at the manufacturing facility where ICs 204 have been fabricated, and at a next stage of the manufacturing/packaging process, the IV to characterize signal propagation delay or timing may be determined to configure/program the IC 204 or the device 202 that may include the IC 204, to describe and identify the inputs in the product specification documents, and so forth.

Test platform 406 of some embodiments may include a circuit board or other platform on which the ICs 204 to be tested may be mounted. For instance in some embodiments, the test platform 406 may include a standard mounting mechanism for a device-under-test (DUT). Some embodiments of the test platform 406 may include, for example, a base with input and output terminals to respectively couple to the input terminal(s) 210 and the output terminal(s) 212 of the IC 204, for purposes of providing input signals (e.g., inputs having binary values) to the IC 204, receiving output signals from the IC 204 that represent an amount of time delay, providing power to the IC 204, providing control signals to the IC 204 (e.g. a control signal instructing the IC 204 to enter a low-power mode), and so forth. Such signals may be provided by the test apparatus 402, the input generator 404, and/or by another apparatus (not shown).

Input generator 404 may be coupled to the test platform 406, and may be arranged to generate the input signals that are provided to the IC 204 mounted on the test platform 406. For example, if the IC 204 has four input terminals 210, the input generator 404 can be configured to generate a set of inputs or an input vector [0001] such that binary values of 0, 0, 0, and 1 may be respectively provided to the sequential element devices of the IC 204 via the four input terminals 306 of the IC 204.

In some embodiments, the input generator 404 may include a signal generator configured to generate one or more signals that represent the input [0001], for example, which may be applied to the sequential element devices of the IC 204 via the input terminals 210 of the IC 204. Other implementations of the input generator 404 may be provided, such as a current source, a voltage source, an arbitrary waveform generator, a pulse generator, one or more logic gates or other logic circuitry, a finite state machine, a processor, a random number generator, or any other suitable software and/or hardware component that may be configurable to generate inputs with different values and to provide the generated inputs to one or more of IC 204 mounted on the test platform 406. In some embodiments, input generator 404 may be responsive to test apparatus 402 to toggle values or to otherwise select and change the inputs that are provided to IC 204 mounted on test platform 406.

In some embodiments, measurement device 408 may include one or more timers that may be configured to measure time delay (e.g., signal propagation delay) of SSPs for results to be latched at output sequential element devices of the SSPs. The latched results may be read out at output terminal(s) 212 of the IC 204, using e.g., scan chains. The values of signal propagation delay or timing measured by the measurement device 408 may be provided to test apparatus 402, so that test apparatus 402 can store and evaluate such values to determine which particular IV resulted in the most and/or sufficiently sparse signal propagation delay or timing modeling equations for each particular IC 204.

Non-Invasive Time Delay Estimation

An example overall measurement method for noninvasive device characterization is now described. First, different inputs or input vectors may be applied to the input terminals of the IC's and provided to the input sequential element devices corresponding to the signal propagation delay or timing of the SSP with respect to such input vectors may be measured. Then, an optimization problem to determine the process variation using the signal propagation delay or timing measurements may be formulated and solved. This process is illustrated with reference to an example circuit shown in FIG. 5.

Figure 5:
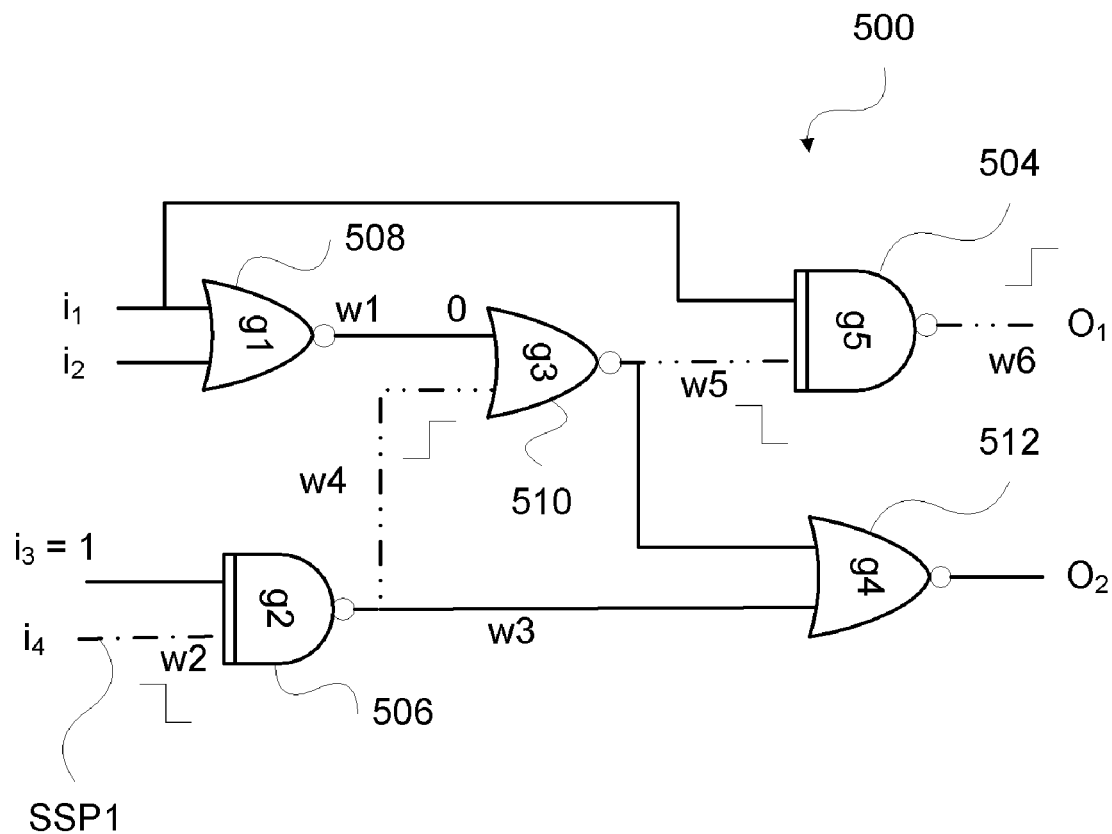
FIG. 5 is a schematic diagram of an example circuit illustrating device input transitions.

FIG. 5 is a schematic diagram of an example circuit 500 illustrating device input transitions in accordance with various embodiments of the present disclosure. Example circuit 500 may be one of the circuits present on the IC 204. In this example, the device level behavior of circuit 500 may be provided by two example NAND gates g5 (504) and g2 (506) and three example NOR gates g1 (508), g3 (510), and g4 (512). The transitions, from logic-0 to logic-1 (rising edge) or vice versa (falling edge), at the different input and output terminals of gates g2, g3, and g5 are shown. The signal propagation delay or timing values for "standard" NAND/NOR gates or other gates and devices of a particular fabricating process may be readily available from various sources, for example, from the manufacturer of the IC (e.g., a specification sheet including nominal delay times may be provided by a vendor or foundry), or from other sources, and may be used as nominal signal propagation delay or timing for the various gates. For the sake of brevity, the effect of time delay due to interconnects are not considered in this example, but may be factored into the computation in a relatively straightforward way.

As noted above, the methods and techniques described in the present specification may be suitable for analysis and determination of signal propagation delay or timing for other components of a circuit and are not limited to devices like logic gates, transmission gates etc. For example, circuit devices may include switches, diodes, transistors, thyristors, transducers, capacitors, inductors, resistors and the like. In other words, the present methods and techniques may be suitable for use for digital, analog, and/or mixed-mode circuits.

Generally, non-invasive signal propagation delay or timing estimation of components within an IC may be performed by measuring the signal propagation delays of a number of SSPs. A system of linear equations may be formed having scaling factors for signal propagation delay or timing of the devices of the SSPs, where the scaling factors may be the unknowns in the equations. Input signals may be applied to input terminals of the IC associated with the SSPs and respective signal propagation delays may be measured at associated output terminals or sequential element of the IC. The signal propagation delay or timing characteristics of the devices may then be estimated by solving the system of linear equations using the measured delays as known values and finding the scaling factors. As more fully described below, the scaling factors account for MV between the different circuit devices.

With continued reference to FIG. 5 as an illustrative example, SSP1, shown as a dotted line, passes through and includes example gates g2, g3, and g5 from associated input i4 to associated output o1. As can be readily seen from FIG. 5, other SSPs are possible, for example from input i1 to output o2. The total path delay of an SSP may generally be an additive combination of delays of the components/devices and interconnect (shown as "wi" such as w1, w2, and the like) included in the SSP. For example, the total path delay for SSP1 may be represented as follows in Equation (2):

$$d(SSP1)=d(w2)+df(g2)+d(w4)+dr(g3)+d(w5)+df(g5)+d(w6) \quad (2)$$

Where d(wi) is interconnect delay of interconnect segment wi, df(gi) is the falling edge delay of gate (or device) gi, and dr(gi) is the rising edge delay of gate (or device) gi.

For clarity and simplicity, the interconnect delays d(wi) may be assumed to be zero in the remainder of this specification. It is understood that such assumption is not a limitation of the present methods and techniques and that these methods and techniques can take into account delays d(wi). With d(wi)=0, Equation (2) may be simplified to:

$$d(SSP1)=df(g2)+dr(g3)+df(g5) \quad (3)$$

As noted above, due to MV, the devices may deviate from their respective nominal values. Thus, based on Equation (1), the delays may be represented as follows:

$$dr(gi)=dr^0(gi)+\xi_{r,gi}l_{gi} \quad (4a)$$

$$df(gi)=df^0(gi)+\xi_{f,gi}l_{gi} \quad (4b)$$

where $dr^0$ (gi) and $df^0$ (gi) are nominal rising and falling delays of gate gi, respectively, $\xi_{r,gi}$ and $\xi_{f,gi}$ are rising and falling constant coefficients for gate gi, and $l_{gi}$ is the scaling factor for gate gi. Generally, $\xi_{r,gi}$ and $\xi_{f,gi}$ may be known while $l_{gi}$ (scaling factors) may be the unknowns that may be found by solving the system of equations.

Equation (3) may now be rewritten in view of Equations (4a) and (4b) as follows:

$$d(SSP1)=df^0(g2)+\xi_{f,g2}l_{g2}+dr^0(g3)+\xi_{r,g3}l_{g3}+df^0(g5)+\xi_{f,g5}l_{g5} \quad (5)$$

$$\text{Now, letting: } b_{ssp1}=\xi_{f,g2}l_{g2}+\xi_{r,g3}l_{g3}+\xi_{f,g5}l_{g5}, \quad (6)$$

Where $b_{ssp1}$ is a constant, Equation (5) may be rewritten as:

$$b_{ssp1}=d(SSP1)-df^0(g2)-dr^0(g3)-df^0(g5) \quad (7)$$

Thus, each SSP in the IC may lead to a linear equation including some $l_{gi}$, and knowing $\xi_{r,gi}$ and $\xi_{f,gi}$, the system of linear equations so constructed may be solved for $l_{gi}$. The system of linear equations may also be written in matrix form as a mathematical shorthand notation as follows. In a circuit with N devices (e.g. gates), M SSPs may be represented as P1, P2, ..., PM. For each path Pj an equation may be written as follows. For a rising transition:

$$\sum \alpha P j(i)\xi_{\lambda r(Pj,gi),gi}l_{gi}=b^r_j, \quad (8a)$$

$$i=1,\ldots,N$$

where: $\alpha Pj(i)=1$, if gi is in Pj;
= 0, otherwise;

and: λr (Pj,i)=subscript "f" for ξ, if gi has falling transition when path Pj is stimulated by a rising transition;
=subscript "r" for ξ, otherwise;
and for a falling transition:

$$\sum \alpha P j(i)\xi_{\lambda f(Pj,gi),gi}l_{gi}=b^f_j, \quad (8b)$$

$$i=1,\ldots,N$$

where: $\alpha Pj(i)=1$, if gi is in Pj;
= 0, otherwise;

and: λf (Pj,i)=subscript "f" for ξ, if gi has falling transition when path Pj is stimulated by a falling transition;
=subscript "r" for ξ, otherwise;

Equations (8a) and (8b) may be written in matrix form as:

$$Al=b \quad (9)$$

where:
$l=[l_{g1}, \ldots, l_{gN}]^T$,
$b=[b_1^r, \ldots, b_M^r, \ldots, b_1^f, \ldots, b_M^f]^T$, and
A=an M×N measurement matrix with the following rows (and columns):

$\alpha P1(1)\xi_{\lambda r(P1,g1),g1} \ldots \alpha P1(N)\xi_{\lambda r(P1,gN),gN}$
$\ldots$
$\alpha PM(1)\xi_{\lambda r(PM,g1),g1} \ldots \alpha Pj(N)\xi_{\lambda r(PM,gN),gN}$
$\alpha P1(1)\xi_{\lambda f(P1,g1),g1} \ldots \alpha P1(N)\xi_{\lambda f(P1,gN),gN}$
$\ldots$
$\alpha PM(1)\xi_{\lambda f(Pj,gi),gi} \ldots \alpha PM(N)\xi_{\lambda f(PM,gN),gN}$ By solving the optimization problem of reducing or minimizing a metric of errors, for example, l1-norm ((i.e., $\min \Sigma_{m=1}^M |E_m|$), or
l2-norm (i.e., $\text{Min} \|Al-b\|_2^2$), of the errors, subject to the linear system of M equations, the unknown variables, that is, the respective scaling factor $l_{gi}$ of each actual (as opposed to nominal or standard) gate g1-g5 can be found.

The created equations for modeling signal propagation delay or timing for devices of an IC may be linear, and to create a new equation that is, with a high probability, independent from the other equations, the input test vectors may be changed and new measurements may be conducted. The l1 norm may be used as an objective function (OF) that is non-linear. The non-linear OF may be converted to a linear one by introducing m new auxiliary variables $E_{absm}$, and adding 2 m new constraints: for each m, $E_{absm} \geq E_m$ and $E_{absm} \geq E_m$. The linearized OF would then be: $\min \Sigma_{m=1}^M E_{absm}$.

To ensure or improve the likelihood that the above linear programming (LP) formulation may be solvable, some embodiments may be adapted to measure as many independent equations (rows) as the number of variables. Also, some embodiments may ensure or attempt to ensure that there are no two or more columns that are linearly scaled versions of each other, since in that case the formulation may not have a unique solution. A final operation before solving the LP may include identifying the variables that are also a linear combination of a subset of other variables in all constraints. Sets of these variables may be grouped together into a single new variable in the constraint. After solving the LP, the scaling factor may be divided for each new variable, equally between the variables that were used to form the scaling factor. With N unknown variables ($l_{gi}$, i=1 . . . N), N independent measurements may be needed to completely determine the solution of Equation (9). However, measurement vectors (rows of matrix A) may be sometimes dependent.

Each input or input vector may determine a row of the measurement matrix A according to the circuit topology. Thus, the rows of the measurement matrix A may not necessarily be independent. To reduce dependency between the rows, and thus the size of matrix A, various methods, as more fully described below, may be used.

Compressive sensing, as more fully described below, may be another way to further reduce the size of matrix A, that is, the number of equations needed to characterize individual devices such as gates.

Compressive Sensing

Compressive Sensing (CS) is a relatively recent numerical analysis technique that may be employed to solve the set of sparse equations. Specifically, given a vector x) in an N-dimensional space which is K-sparse, that is, has K non-zero components, using compressive sensing, this vector can be reconstructed with M=O(K log(N/K)) linear measurements:

$$P=Ax+e, \quad (10)$$

where A is a M×N measurement matrix, P includes the measurements, and e is the measurement noise or error.

The sparse vector x can be recovered from the measurements using the following convex optimization:

$$\text{Min } \|x\|_1 + \lambda \|p - Ax\|_2^2 \quad (11)$$

For some appropriate λ depending on the noise variance. In the absence of noise, under certain conditions on A, Equation (11) may be used to exactly recover x.

This formulation may be robust even if vector x is not sparse but is compressible. A compressible vector generally has very few significant coefficients and can be well approximated by a K-sparse representation. A good model for compressible vectors may be the weak norm $l_p$ ball for p<1, that is, the set of vectors whose coefficients decay as a power law:

$$|x|_{(i)} \leq r i^{-1/p}, 1 \leq i \leq N \quad (12)$$

where $x=(x1, x2, \ldots, xN)$ and $x_{(i)}$ is i-th largest element of x.

In the same framework, a vector might be sparse in a sparseness-inducing basis W instead of a canonical domain. Specifically, if x=Ws, where s is sparse instead of x, and W is the sparseness-inducing basis, then Equation (10) becomes $$P=AWs+e, \quad (13)$$

Thus the problem may be reformulated as the recovery of a sparse s from y, acquired using the measurement matrix AW.

In some embodiments, devices may be located on a regular rectangular grid on the IC 204. Process variation on the regular grid may be denoted by $H=\{h_{s,t}\}$ s=1 . . . T, t=1 . . . R,. where $h_{s,t}$ may be variation of the gate located at the (s, t)-th point of the grid. All the elements of the matrix H may be stacked in a long column vector S.

In other embodiments, because of the area and the gate constraints, the gates may not be arranged on regular grids, but rather may be arranged in an irregular manner. In these embodiments, a dense regular grid may be used where the center of each gate is close to some grid point for all the gates in the IC 204. The variation of each gate gi may be assigned to a point on the dense regular grid that is closest to the center of the gate. If there are more than one closest point, one of them may be selected randomly. The remaining grid points may be assigned to free variables that do not correspond to physical gates and do not affect the measurements.

Models for Signal Propagation Delay or Timing Characterization

According to some embodiments, one or more models for MV, signal propagation delay or timing, and measurement error may be used as part of the characterization technique. Examples of such models are described below.

A. Variability Models

According to some embodiments, the MV may be modeled. As previously explained above, process variations may be generally divided into inter-die variations ($\delta_{inter}$) between ICs and intra-die variations ($\delta_{intra}$) within the IC 204.

To model intra-die variations, some embodiments may use equations from L. Cheng et al., "A fast simultaneous input generation and gate replacement algorithm for leakage power reduction," in *Annual ACM IEEE Design Automation Conference*, pages 117-120, 2006, and from A. Srivastava et al., "Statistical Analysis and Optimization for VLSI: Timing and Power," in Series on Integrated Circuits and Systems, 2005.

These equations model a parameter p located at (x, y) as $p= \bar{p}+\delta_x x+\delta_y y+\epsilon$, wherein $\bar{p}$ may be a nominal value of the parameter p at the (0, 0) die location; $\delta_x x$ and $\delta_y y$ may be gradients of the spatial variations of the parameter p in the x and y directions; and $\epsilon$ is a random intra-chip variation component. A multivariate normal distribution may be used for modeling the vector of all random components across the chip and the intra-chip correlations among them. Furthermore, the grid model that partitions the space into grids may be used in some embodiments, where devices within the same grid may be highly correlated and devices in further grids may be correlated proportional to their distances.

B. Measurement Error Model

Environmental conditions, noise, packaging, thermal effects and many other phenomena (e.g., parasitic capacitance and inductance, etc.) may affect the external signal propagation delay or timing readings and cause measurement errors. The errors may vary from one design to the next (e.g. because of the differences in size, layout, and environment). The measurement error may be modeled with at least three different distributions: Gaussian distribution, uniform distribution, and triangular distribution, while the distribution variances may be varied. In some embodiments, user-defined smooth distribution that has a limited number of discontinuities may be used.

Pre-Processing to Increase Accuracy of Solution

In various embodiments, a number of pre-processing techniques may be used to increase accuracy of the solution of the set of equations. These techniques may include clustering of devices (e.g. gates) based on physical proximity, clustering of devices (e.g. gates) using multiple approximation grids, equation selection based on number of variables, equation selection based on distance (e.g., Hamming distance), selection of pairs of IVs, input-output pair selection, taking multiple measurements, and splitting variables. Each of these techniques is further described below.

Figure 6:
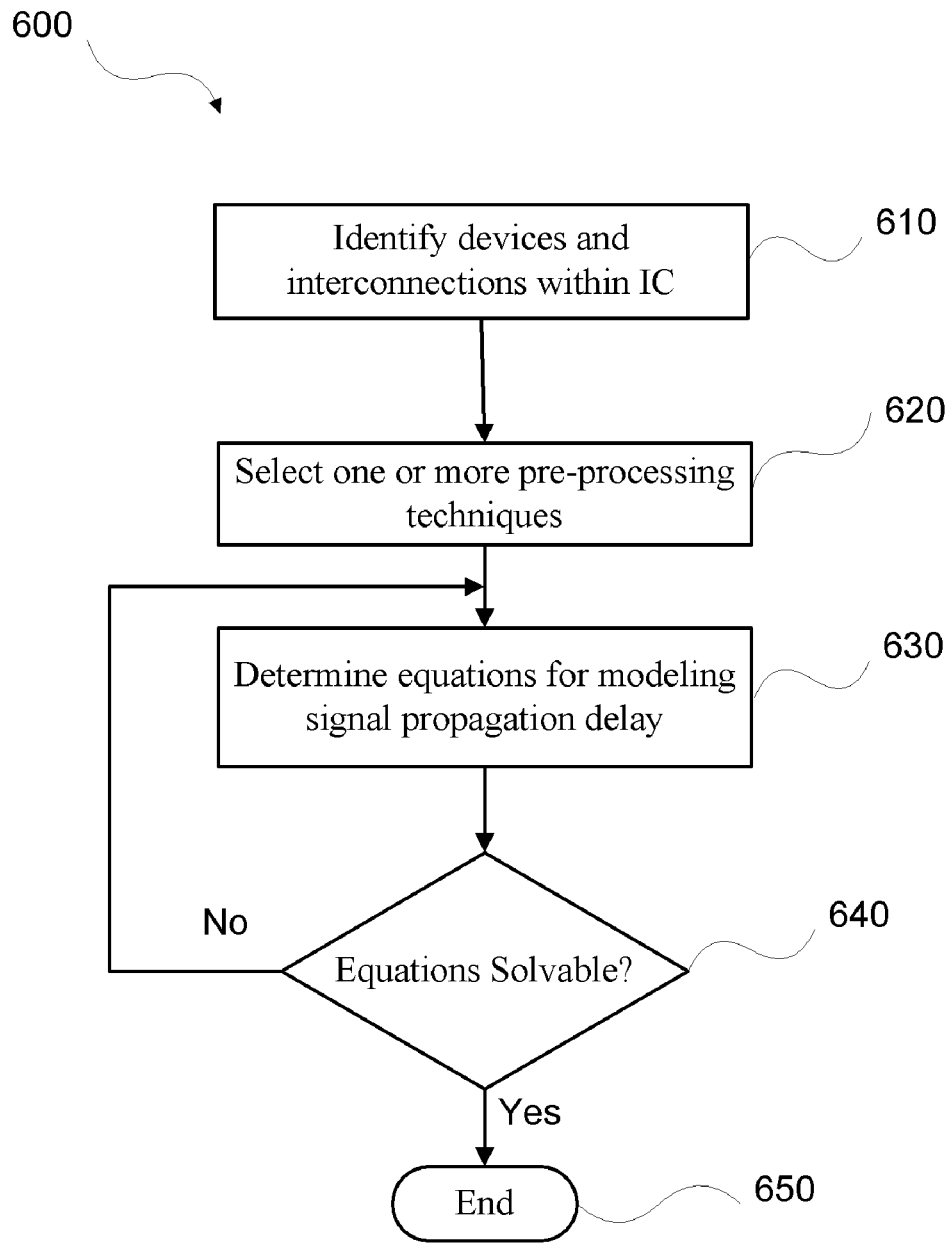
FIG. 6 is a high-level flowchart illustrating an example method, similar to the method of FIG. 1, including the use of pre-processing techniques.

FIG. 6 is a high-level flowchart illustrating an example method 600, similar to the method of FIG. 1, including the use of pre-processing techniques in accordance with various embodiments of the present disclosure. Method 600 may include one or more operations, functions or actions as illustrated by blocks 610, 620, 630, 640 and/or 650. Method 600 may start at block 610.

At block 610 ("Identify devices and interconnections within IC") devices (e.g. gates) within IC 204 may be identified for use with pre-processing techniques, as noted above and more fully described below. The identification of devices may include information about their position within the IC, relationship to other or devices, and/or other locality information, such as density of devices, density gradient, and the like. As noted above, in some embodiments, the information related to the position of the devices may be included in a hardware specification file having a format such as HDL, netlist, SPICE, RTL, XML, or general programming languages such as C++ and C#. In other embodiments, basic information about the devices may be included in the hardware specification file while information about position of the devices relative to each other may be derived by computation by the computing device that receives the hardware specification file. Block 610 may be followed by block 620.

At block 620 ("Select one or more pre-processing techniques"), one of several pre-processing techniques, such as those mentioned above, may be selected for the purposes of measurement and for derivation of equations. Each of the pre-processing techniques, more fully described below, may provide a more accurately solvable matrix for use with sampling and/or improve accuracy of the results of such sampling. For example, pre-processing techniques, such as clustering of the devices and selection of equations may allow fewer necessary measurements and also fewer equations for faster computation. While other pre-processing techniques, such as variable splitting and taking multiple measurements, may increase the accuracy of results of such measurements. Some of the pre-processing techniques may be used alone or together. For example, clustering of devices based on physical proximity and taking multiple measurements may be used independently or together to increase sparseness of equations and/or enhance accuracy of results. Block 620 may be followed by block 630.

At block 630 ("Determine equations for modeling signal propagation delay"), the selected technique(s) for pre-processing may be used as a basis for determining the system of equations to be used to model the signal propagation delay or timing of various devices in the IC. As noted above, each measurement may correspond to an equation that may be used as part of the system of equations to solve for and obtain scaling factors $1_{gi}$. Therefore, determination and selection of which equations to be used as part of the system of equations may be based on the pre-processing techniques and also on the output measurements. For example, the equations that may be selected to be part of the system of equations based on the pre-processing technique of clustering devices together may be different from the equations selected based on the pre-processing technique of equation selection based on the number of variables in relation to the equations, as more fully described below. Block 630 may be followed by decision block 640.

At decision block 640 ("Equations solvable accurately?"), method 600 may ascertained whether the selected pre-processing techniques and equations provide accurately solvable matrices and equations that may be used in conjunction with the measurements to obtain the scaling factors. If not, the process may proceed from decision block 640 to block 620 where different or more pre-processing techniques may be selected for better results. Otherwise, the process may proceed from decision block 640 to block 650, where method 600 may terminate.

The pre-processing techniques may be categorized into several types of techniques. For example, grouping of devices and multiple approximation grid techniques may be categorized as "clustering" category of pre-processing techniques, while pre-processing techniques directed to selection of equations may be categorized as "equation selection" category of pre-processing techniques. Various pre-processing techniques may be categorized according to different criteria and such categorizations are not meant to limit the disclosures of this specification and are merely used as tools for convenience and organization of matters discussed. Some of these pre-processing categories are further described below with respect to FIGS. 7A and 7B.

Figure 7A:
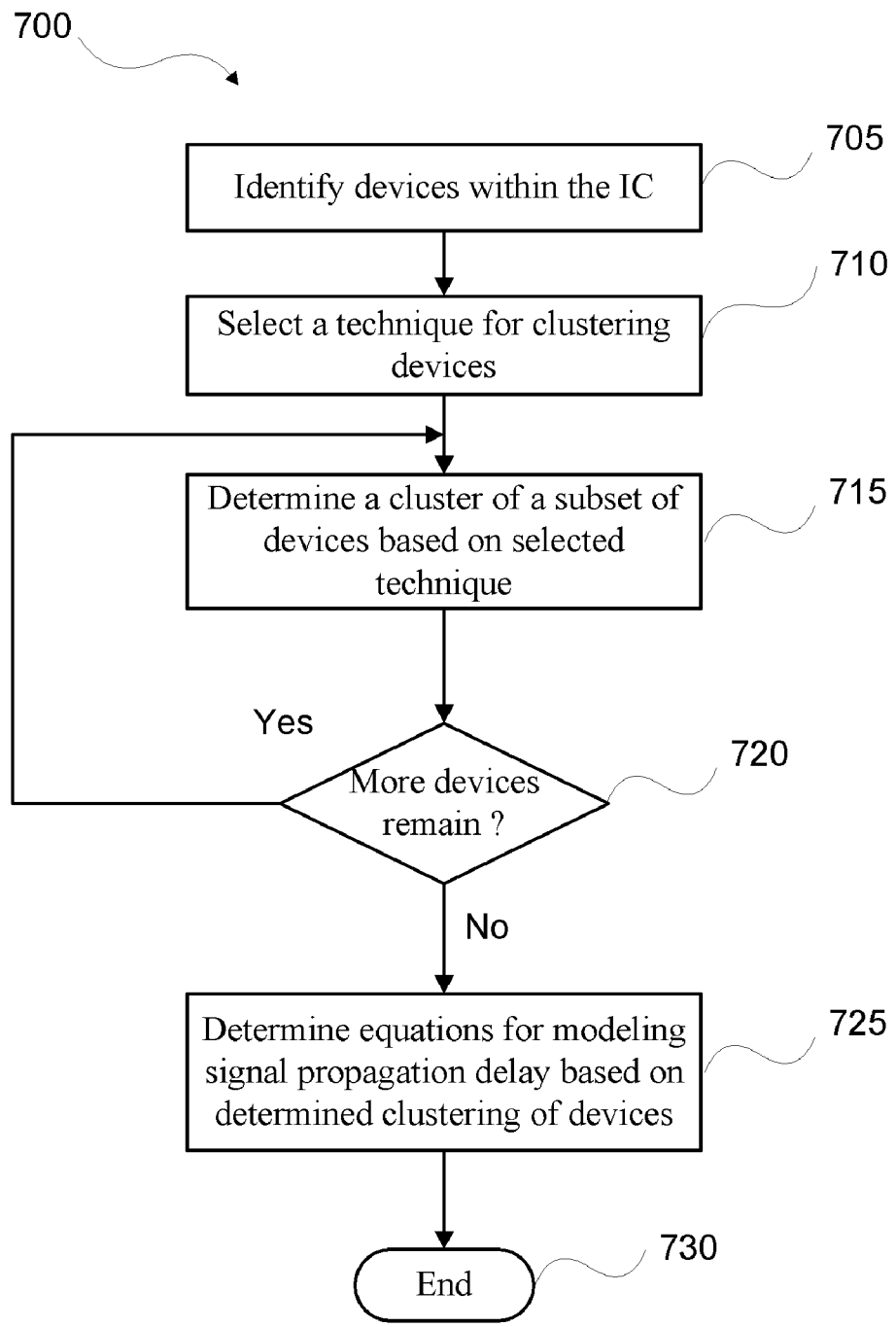
FIG. 7A is a flowchart of an illustrative method for grouping and/or clustering devices.

FIG. 7A is a flowchart of an illustrative method 700 for grouping devices (e.g. gates), in accordance with various embodiments of the present disclosure. Method 700 may include one or more operations, functions or actions as illustrated by blocks 705, 710, 715, 720, 725, and/or 730. Method 700 may start at block 705.

At block 705 ("Identify devices within the IC") devices (e.g. gates) within IC 204 may be identified for use with pre-processing techniques, as noted above and more fully described below. The identification of devices may include information about their position within the IC, relationship to other devices, and/or other locality information, such as density of devices, density gradient, and the like. As noted above, in some embodiments, the information related to the position of the devices may be included in a hardware specification file having a format such as HDL, netlist, SPICE, RTL, XML, or general programming languages such as C++ and C#. In other embodiments, basic information about devices may be included in the hardware specification file while information about position of the devices relative to each other may be derived by computation by the computing device that receives the hardware specification file.

At block 710 ("Select a technique for clustering devices"), one of the pre-processing techniques that may be used to cluster devices (e.g. gates) together may be selected to aid in making the equations more accurately solvable. Clustering devices (e.g. gates) based on physical proximity may allow reduction of the number of equations and variables for use with measurements. Device clustering may be used to cluster e.g. gates together and form signal propagation delay or timing modeling equations on the basis of the clustered devices. Generally, one scaling factor $1_{gi}$ may be used for each cluster of devices so formed, applicable to all devices within the respective cluster. Physically close devices 206 in IC 204 may be more similar to each other, in terms of characteristics, such as signal propagation delay, than other devices which are relatively distant. This is, at least in part, because physically close devices may be subjected to similar physical and chemical phenomena and forces (for example, temperature, stress and strain, electro-migration, fatigue, and the like) that affect the devices similarly. Therefore, there may be a significant locality in manufacturing variability. As such, devices in close physical proximity to each other may be grouped together and be assigned a single scaling factor for the cluster, rather than a separate scaling factor for each device. In some embodiments, cluster of devices may start with two devices that are closest together to form a cluster. Next, more devices, which may be within a threshold distance to any other device located within the cluster, may be added to the cluster. Once there are no more devices found that are within the threshold distance from any other device in the cluster, the cluster devices may be closed and/or another cluster may be started. This process may be iteratively continued until all devices are assigned to a cluster. Different clusters may be assigned the same or different threshold distances. In each cluster the maximal or threshold distance between the devices within the cluster may be within a user-defined or predetermined threshold distance.

Another pre-processing technique that may be used to cluster multiple devices is the use of multiple approximation grids to associate or cluster devices (e.g. gates) with each other. By imposing multiple grids of different resolutions and phase shifts and mapping devices (e.g., gates) to such grids, the number of devices that are used to form equations and the corresponding number of measurements performed may be reduced. In some embodiments, a computational sweep algorithm may be used to find the best phase shifts of grids. In these embodiments, the boundaries of a target grid may be shifted in a "sliding window" fashion to cover different devices. In other embodiments, the quality of grid shifts may be calculated using the total or maximal distance of each device to an intersection point of the grid. In these other embodiments, the maximal distance acceptable for a desired quality level may be set to a predetermined value. Such maximal distance may be the same or different for different grids. Using this technique, a device included in one grid may be maximally different, with respect to a threshold, from devices in other grids, and conversely, the device in the one grid may be maximally similar, with respect to a threshold, with other devices in the one grid, providing clustering of similar devices together in the same grid and placing dissimilar devices in different grids. Block 710 may be followed by block 715.

At block 715 ("Determine a cluster of a subset of devices based on selected technique"), the device (e.g. gate) identification information acquired at block 705 and the technique selected at block 710 may be used to selectively cluster the devices together. Block 715 may be followed by decision block 720.

At decision block 720 ("More devices remain?"), method 700 may ascertain whether there are still more devices (e.g. gates) that have not been added to a cluster. If so, the process may proceed from decision block 720 to block 715 to apply the selected technique to the remaining devices (e.g. gates). Otherwise, the process may continue from decision block 720 to block 725.

At block 725 ("Determine equations for modeling signal propagation delay based on determined clustering of devices"), equations may be determined for use in the system of equations based on the clusters of devices (e.g. gates) constructed at block 715. Generally, each such cluster of devices (e.g. gates) may be treated as a "super device" (or a "super gate") for which an equation or scaling factor may be allocated/associated. This way, instead of having as many equations as number of devices in the IC, only enough equations may be needed to represent the clusters so constructed. After the scaling factors are determined by solving the system of equations, the scaling factor so obtained for each cluster may be applied equally to each device within the cluster. Processing may continue from block 725 to block 730, where process 700 may terminate.

Figure 7B:
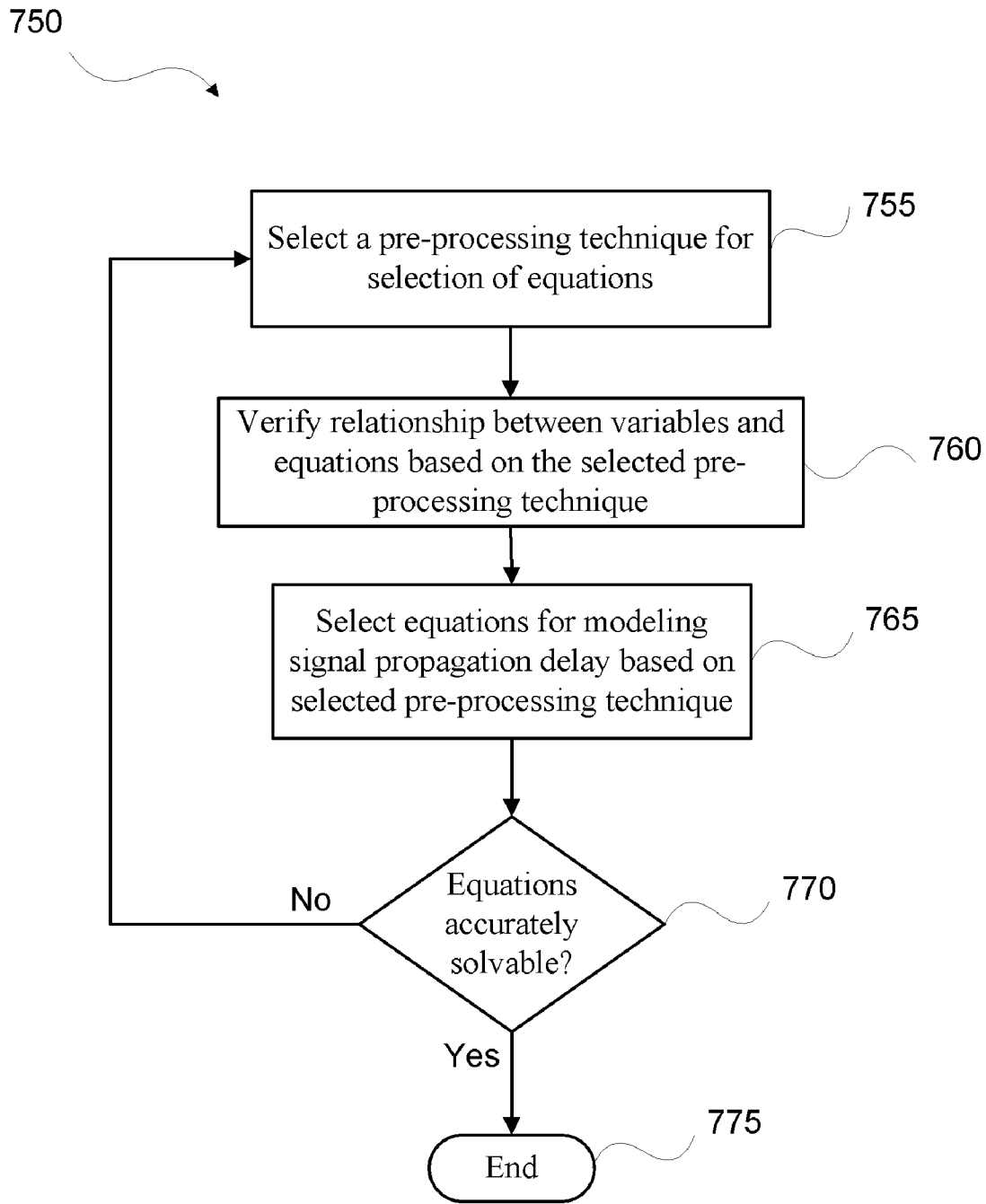
FIG. 7B is a flowchart of an illustrative method for selecting equations based on pre-processing techniques for selection of equations.

As noted above, selection of equations may be another category of pre-processing techniques. FIG. 7B is a flowchart of an illustrative method 750 for selecting sparse equations based on pre-processing techniques for selection of equations in accordance with various embodiments of the present disclosure. Method 750 may include one or more operations, functions or actions as illustrated by blocks 755, 760, 765, 770, and/or 775. Process 750 may start at block 755.

At block 755 ("Select a pre-processing technique for selection of equations"), one or more of the pre-processing techniques for selection of equations may be selected. One selected pre-processing technique may be equation selection based on distance. Using this technique, the accuracy of device signal propagation delay or timing characterization may be improved by repeating the measurement procedure a user-specified or predetermined number of times. In each iteration, a subset of equations with the cardinality (defined as number of members in a set) specified by the user or as predetermined may be selected. In some embodiments, the equations may be selected so as to increase or maximize a function defined over a Hamming distance between the equations. An increased Hamming distance between equations causes the equations to be more independent, and/or reduce or eliminate dependency among the equations. The Hamming distance may be defined as 0 if either a specific equation appears in a pair of subsets or none. Otherwise, the Hamming distance is set to 1. In some other embodiments, a dissimilarity function may be defined as a function of difference between how many times each variable appears in each pair of the equation subsets.

In one of the pre-processing techniques for selection of sparse equations as many variables as possible may be allowed to appear in an equal number of equations. For example, this technique may allow 20 variables each to appear in 12 equations, and not necessarily the same 12 equations. In another one of such techniques, the number of appearances of variables that appear the smallest number of times may be increased or maximized. In yet another one of such techniques, the number of appearance of Q (a constant) variables with rarest representation may be maximized. In still another one of such techniques, the ratio of the variable that appears the least number of times with respect to the total number of equations may be optimized. In yet another one of such techniques, the weighted number of appearances of a variable, where the weight may be proportional to the coefficient in front of the variable, is increased or substantially maximized. Processing may continue from block 750 to block 760.

At block 760 ("Verify relationship between variables and equations based on the selected pre-processing technique"), the relationships between the number of variables and equations may be verified. For example, when using the pre-processing technique where the number of appearance of variables that appear the smallest number of times may be increased or maximized, the number of all variables may have to be counted to see which one appears the smallest number of times and then to select the equations so that the number of the one variable so determined may be increased or approximately maximized in the system of equations. Processing may continue from block 760 to block 765.

At block 765 ("Select equations for modeling signal propagation delay based on selected pre-processing technique"), equations may actually be selected based on one or more of the equation selection techniques described above. Processing may continue from block 765 to decision block 770.

At decision block 770 ("Equations accurately solvable?"), method 750 may ascertain whether the equations selected at block 765 meet accuracy criteria or not. In some embodiments, such accuracy criteria may be pre-determined. In other embodiments, the accuracy criteria may be determined based on performance parameters, such as execution time for solution of the equations, accuracy of results, or a combination thereof. If the sparseness requirements are satisfied, process 750 may proceed from decision block 770 to block 775 where process 750 may terminate. Otherwise, the process may proceed from decision block 770 to block 755 to repeat the process.

Another pre-processing technique is selecting particular pairs of input vectors that are consecutively applied so that at least one output sequential element device of the IC switches. The equations may be formed by backtracking from the output sequential element device (s) that switched for a particular pair of consecutive input vectors. In some embodiments, backtracking from an output terminal to an input terminal may be performed to capture substantially longest delay SSP with high probability. In some embodiments, the longest delay path may be estimated using nominal delays of the devices in the SSP. In other embodiments, estimation of the longest delay path may be based on other criteria such as experience with a particular IC or technology. The process of selecting input vectors and identifying likely longest delay paths may be repeated iteratively, using the results from a previous iteration to find the longest delay path from the input terminal to the output terminal. This technique may be beneficial because in presence of a constant error of measurements due to limitations of the instrumentation, the relative impact of the measurement error is reduced when the measured quantity is relatively large.

Another pre-processing technique is selecting input-output sequential element device pairs that may include an SSP with substantially longest delay with high probability. Generally, an input-output pair of sequential element devices may define multiple SSPs corresponding to each of the multiple paths a signal may take through a circuit and/or corresponding to the different components and devices on each of these paths in the circuit. Among the multiple SSPs, some may have a longer signal propagation delay than others. Additionally, the same input sequential element device may be connected to multiple output sequential element devices through various signal paths in the IC, and similarly, the same output sequential element device may be connected to multiple input sequential element device through various signal paths in the IC. Thus, the selection of the input-output sequential element device pairs that may include a long delay path may be advantageous in increasing accuracy of measurements and/or increasing accuracy.

Another pre-processing technique is selecting input-output sequential element device pairs that contain relatively small number of variables, as defined by a predetermined threshold by a user or otherwise determined. The threshold for the number of variables may be determined based on the number of devices that switch their respective output states based on input stimulation, and/or the sum of their estimated delays.

Another pre-processing technique for improving the accuracy of device-level signal propagation delay characterization may be using multiple measurements for the same pair of inputs or input vectors. In some embodiments, the measurements may be conducted K1 (a constant) times in a round robin fashion, where K1 is a predetermined constant. In some other embodiments, the measurements may be conducted K1 times randomly.

Another pre-processing technique may be splitting variables. This technique may be used for improving the accuracy of device signal propagation delay characterization by splitting all or a user-specified or predetermined number of variables into two of more replicas that are treated as separate variables by the consequently applied procedure for solving a system of linear equations. In some embodiments, each selected variable may be split in such a way that each replica of the selected variable appears in disjoint sets of other variables over all equations. In some other embodiments, selected variables may be split in such a way that correlations (for example, having similar or close values) between different replicas of the pairs of the selected variables is increased or maximized. At least two benefits may be realized by splitting variables. First, splitting variables may provide a relatively effective and inexpensive way to establish and verify the accuracy of the overall procedure. This is so because if replicas of each split variable produce identical or very similar values, upon solution of the system of equations, then that may be a strong indicator that the overall procedure is accurate. However, if there is a significant discrepancy between the values produced by the replicas of the variables, then that may be an indication or sign that additional measurements have to be performed with emphasize on the variables that have the highest discrepancy. Second, different replicas of the variables may be mutually grouped according to different similarity criteria due to physical proximity. Therefore, now the device signal propagation delay characterization may be provided with suitable and appropriate proximity approximation.

Post-Processing to Increase Accuracy of Solution

In addition to the pre-processing techniques, a number of post-processing techniques may also be used to improve the accuracy of the solution of the equations. These techniques may include performing multiple runs of measurements, conducting learn and test procedure, boosting, and establishing interval of confidence.

One of the post-processing techniques may include performing multiple runs of measurements. In this technique, multiple runs of the basic procedure discussed above for calculating Equation (3) may be performed and the solution obtained for each variable may be statistically processed. In some embodiments, statistical measures may be used, such as average, median, and the like, to calculate the statistical value of each variable. In some other embodiments, a percentage of the most extreme values (statistical outliers) may be eliminated before applying a statistical selection function for the calculation of the value of each variable.

Another one of the post-processing techniques may include conducting learn and test procedure. Using this technique, statistical models may be created for the value of each variable where the explanatory variables of the statistical models include the properties of the equations (for example, how many times a particular variable appears) and measurements (for example, the expected error, the average, or the median value of all measurements used in a particular run). The accuracy of each statistical model may be evaluated using new runs of the procedure for device characterization and the model with best predictive capabilities may be accepted as the overall solution.

Another one of the post-processing techniques may include boosting. The boosting procedure may first used to create statistical models for value of each variable where the explanatory variables include the properties of the equations (for example, how many times a particular variable appears) and measurements (for example, the expected error or the average or the median value of all measurements used in a particular run). The accuracy of each model may be evaluated using the existing runs (different from the learn and test procedure) of the procedure for device characterization and the model with best prediction abilities may be accepted as the overall solution.

Another one of the post-processing techniques may include establishing interval of confidence. Establishing an interval of confidence and/or other statistical validation measures may be accomplished by applying boosting, learn and test procedure, as discussed above, and/or other statistical validation techniques on the results of the multiple runs of the procedure for device characterization. In one embodiment, establishing the interval of confidence and other statistical validation measures may be accomplished by using physical laws (for example, effect of strain/stress, and temperature effects) and/or characteristics, such as analyzing and using the locality properties of the calculated signal propagation delay of each device (e.g. gate).

Article of Manufacture

FIG. 8 is a diagram showing an example article of manufacture having a computing program product 801 arranged in accordance with various embodiments of the present disclosure. In various embodiments, computing program product 801 may comprise a signal bearing medium 803 having programming instructions stored therein. The computing signal bearing medium 803 may be, for example, a compact disk (CD), a digital versatile disk (DVD), a solid-state drive, a hard drive, or other appropriate type of data/instruction storage medium. The computing signal bearing medium 803 may have stored therein in a number of programming instructions 805. The programming instructions 805 when executed by a processor of an apparatus may cause the apparatus to determine a system of signal propagation delay or timing equations for the devices (e.g. gates) within IC 204. In various embodiments, when executed, the programming instructions 805 may also cause the apparatus to preprocess the system of equations according to a number of techniques such as clustering devices, splitting variables, selecting equations, and selecting input-output terminals, among others, as described above, to make the measurements more accurate and the equations sparser and suitable for use with compressive sensing. In still other or same embodiments, when executed, the programming instructions 805 may also cause the apparatus to post-process the results of solving the signal propagation delay equations to improve the sparseness of the equations. These post-processing techniques may include performing multiple runs of measurements, conducting learn and test procedure, boosting, and establishing interval of confidence. Embodiments are not limited to any type or types of computing program products.

In various embodiments, the signal bearing medium 803 may include a computer readable medium 807, including but not limited to a CD, a DVD, a solid-state drive, a hard drive, computer disks, flash memory, or other appropriate type of computer readable medium. In various embodiments, the signal bearing medium 803 may also include a recordable medium 809, including but not limited to a floppy disk, a hard drive, a CD, a DVD, a digital tape, a computer memory, a flash memory, or other appropriate type of computer recordable medium. In various embodiments, the signal bearing medium 803 may include a communications medium 811, including but not limited to a fiber optic cable, a waveguide, a wired or wireless communications link, etc.

Computing System

Figure 9:
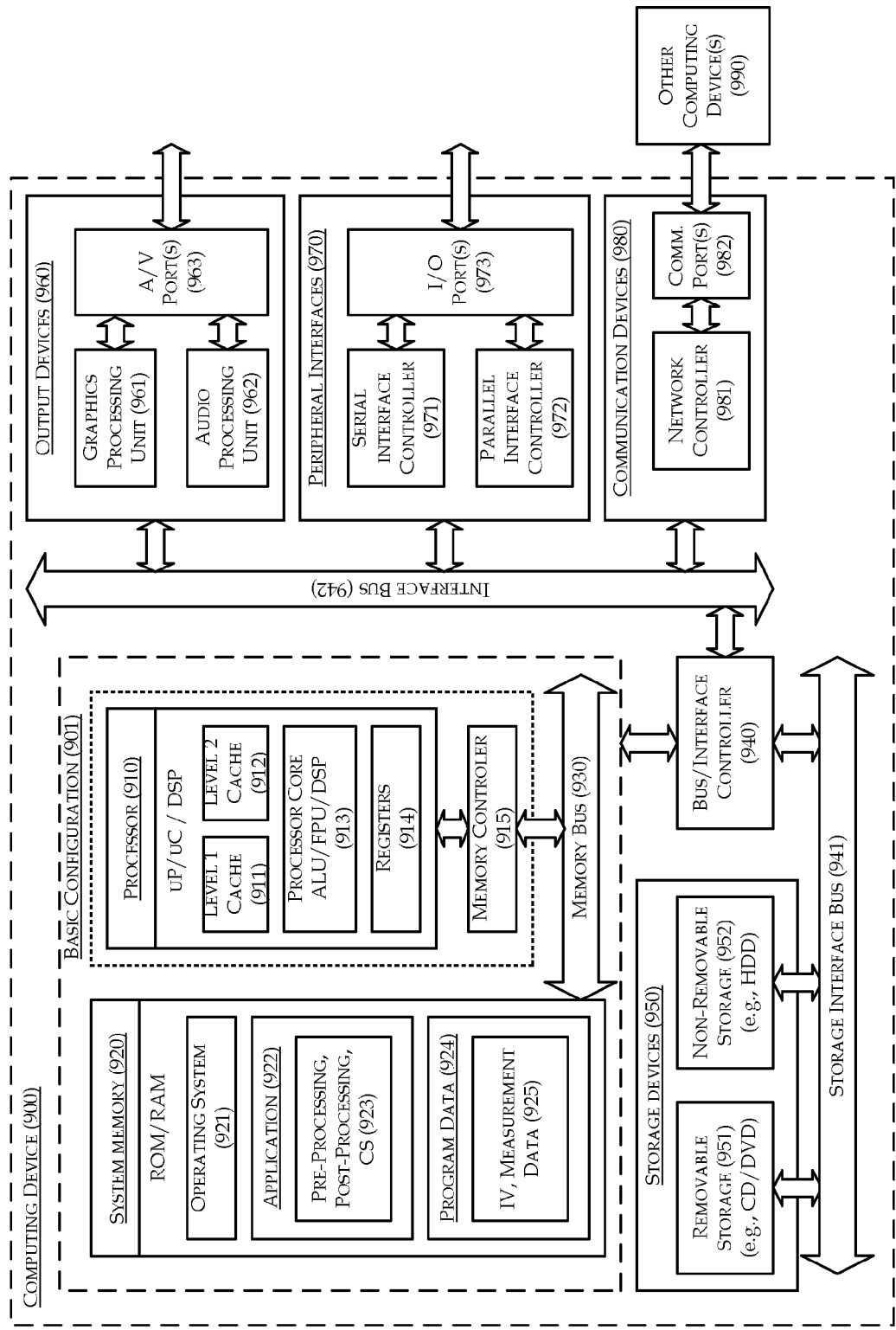
FIG. 9 is a block diagram illustrating an example computing device/system that is arranged for selecting inputs for reducing or minimizing leakage time delay of a number of IC in view of MC, all arranged in accordance with embodiments of the present disclosure.

FIG. 9 is a block diagram illustrating an example computing device 900 that is arranged for selecting inputs for reducing or minimizing leakage time delay of a number of IC in view of MC, in accordance with the present disclosure. In a very basic configuration 901, computing device 900 typically may include one or more processors 910 and system memory 920. A memory bus 930 may be used for communicating between the processor 910 and the system memory 920

Depending on the desired configuration, processor 910 may be of any type including but not limited to a microprocessor ($\mu$P), a microcontroller ($\mu$C), a digital signal processor (DSP), or any combination thereof Processor 910 may include one more levels of caching, such as a level one cache 911 and a level two cache 912, a processor core 913, and registers 914. An example processor core 913 may include an arithmetic logic unit (ALU), a floating point unit (FPU), a digital signal processing core (DSP Core), or any combination thereof An example memory controller 915 may also be used with the processor 910, or in some implementations the memory controller 915 may be an internal part of the processor 910.

Depending on the desired configuration, the system memory 920 may be of any type including but not limited to volatile memory (such as RAM), non-volatile memory (such as ROM, flash memory, etc.) or any combination thereof System memory 920 may include an operating system 921, one or more applications 922, and program data 924. Application 922 may include programming instructions 923 to perform the operations associated with one or more of the various methods and/or techniques described herein. In a particular example, the programming instructions may include instructions to determine the signal propagation delay or timing characterizations, select specialized IV pairs, select input-output terminals, and the like, in accordance with various described embodiments such as method 100, method 600, and/or method 700. Application 923 may also include instructions for performing the earlier described pre-processing of signal propagation delay equations, post-processing of results of solving the signal propagation delay or timing equations, and applying CS techniques to solve the equations. Program Data 924 may include data associated the ICs (e.g., device/gate descriptions and/or related interconnect), the inputs selected for the IC, and/or programming instructions 923.

Computing device 900 may have additional features or functionality, and additional interfaces to facilitate communications between the basic configuration 901 and any required devices and interfaces. For example, a bus/interface controller 940 may be used to facilitate communications between the basic configuration 901 and one or more data storage devices 950 via a storage interface bus 941. The data storage devices 950 may be removable storage devices 951, non-removable storage devices 952, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 920, removable storage 951 and non-removable storage 952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 900. Any such computer storage media may be part of device 900.

Computing device 900 may also include an interface bus 942 for facilitating communication from various interface devices (e.g., output interfaces, peripheral interfaces, and communication interfaces) to the basic configuration 901 via the bus/interface controller 940. Example output devices 960 include a graphics processing unit 961 and an audio processing unit 962, which may be configured to communicate to various external devices such as a display or speakers via one or more A/V ports 963. Example peripheral interfaces 970 include a serial interface controller 971 or a parallel interface controller 972, which may be configured to communicate with external devices such as input devices (e.g., keyboard, mouse, pen, voice input device, touch input device, etc.) or other peripheral devices (e.g., printer, scanner, etc.) via one or more I/O ports 973. An example communication device 980 includes a network controller 981, which may be arranged to facilitate communications with one or more other computing devices 990 over a network communication link via one or more communication ports 982.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 900 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 900 may also be implemented as a personal computer including both laptop computer and non-laptop computer configurations.

In conclusion, embodiments have addressed post-silicon time delay characterization by determining a system of signal propagation delay equations for the gates within the IC. The system of equations may be preprocessed according to a number techniques such as clustering gates, splitting variables, selecting equations, selecting input-output terminal pairs, and using multiple approximation grids, among others, as described above, to make the equations sparse and suitable for use with compressive sensing. In addition, post-processing of computational results, such as performing multiple runs of measurements, conducting learn and test procedure, among others, as described above, to further improve the accuracy of compressive sensing-based measurements and signal propagation delay characterization.

Claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a storage medium or storage media. This storage media, such as CD-ROMs, computer disks, flash memory, or the like, for example, may have instructions stored thereon, that, when executed by a system, such as a computer system, computing platform, or other system, for example, may result in execution of a processor in accordance with claimed subject matter, such as one of the implementations previously described, for example. As one possibility, a computing platform may include one or more processing units or processors, one or more input/output devices, such as a display, a keyboard and/or a mouse, and one or more memories, such as static random access memory, dynamic random access memory, flash memory, and/or a hard drive.

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations. Moreover, when terms or phrases such as "coupled" or "responsive" or "in response to" or "in communication with", etc. are used herein or in the claims that follow, these terms should be interpreted broadly. For example, the phrase "coupled to" may refer to being communicatively, electrically and/or operatively coupled as appropriate for the context in which the phrase is used.

In the preceding description, various aspects of claimed subject matter have been described. For purposes of explanation, specific numbers, systems and/or configurations were set forth to provide a thorough understanding of claimed subject matter. However, it should be apparent to one skilled in the art and having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now, or in the future, occur to those skilled in the art. It is, therefore, to be understood that the appended claims are intended to cover all such modifications and/or changes as fall within the true spirit of claimed subject matter.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that individual function and/or operation within such block diagrams, flowcharts, or examples may be implemented, individually and/or collectively, by a wide range of hardware, software, firmware, or virtually any combination thereof In some embodiments, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

What is claimed is:

1. A method for a computing device to characterize signal propagation delay characteristics associated with a plurality of devices in an integrated circuit (IC) having a plurality of sequential element devices, combinatorial devices and interconnects interconnecting the sequential element devices and the combinatorial devices, the method for the computing device comprising:
    receiving a specification that identifies the devices in the IC; forming a plurality of groupings of the devices using the specification, wherein each grouping of the devices is associated with one of a plurality of sensitizable signal paths in the IC, wherein each sensitizable signal path comprises one or more interconnected sequential element devices;
    Forming one or more clusters of the devices to improve accuracy of a solution of a set of equations associated with delays of the sensitizable signal paths;
    receiving measurements of signal propagation delays responsive to two consecutive input vectors applied to the sequential element devices associated with the plurality of sensitizable signal paths; and
    solving the set of equations to determine the signal propagation delay characteristics of the plurality of devices based at least in part on the received measurements.

2. The method of claim 1, wherein the receiving measurements comprise receiving post-processed measurements processed to reduce measurement errors.

3. The method of claim 2, wherein processing of the post-processed measurements comprises either performing statistical analysis of raw measurements, or boosting from raw measurements.

4. The method of claim 1, wherein the forming a plurality of groupings of the devices associated with sensitizable paths comprises using transitive fan-ins of outputs of the combinatorial devices.

5. The method of claim 1, wherein the forming one or more clusters of the devices comprises associating devices that are physically close to one another as one of the clusters.

6. The method of claim 1, wherein the forming one or more clusters of devices comprises using a grid to partition the devices, wherein a distance of each device within a cluster to an intersection point of the grid is less than a predetermined threshold.

7. The method of claim 1, wherein the solving the set of equations comprises using compressive sensing techniques.

8. The method of claim 1, wherein the receiving a specification comprises receiving a specification expressed in a selected one of Hardware Description Language, Register Transfer Language or eXtensible Markup Language.

9. A method for characterizing timing characteristics associated with a plurality of devices in an integrated circuit (IC) having a plurality of sequential element devices, combinatorial devices and interconnects interconnecting the sequential element devices and the combinatorial devices, the method comprising:
    applying consecutively two input vectors to the sequential element devices of the IC with a tester device, wherein the sequential element devices are associated with sensitizable signal paths in the IC, wherein the sensitizable signal paths are associated with a set of equations, with each of the sensitizable signal paths including one or more interconnected sequential element devices, and at least one of the sensitizable signal paths including a cluster of the devices that are clustered to increase accuracy of a solution of the set of equations associated with the sensitizable signal paths;
    measuring corresponding timing of responses of the sensitizable signal paths to the input vectors; and
    determining the timing characteristics of the devices with a computing device by solving the set of equations using measurements.

10. The method of claim 9, wherein the solving the set of equations comprises using compressive sensing techniques.

11. The method of claim 9, further comprising using a pre-processing technique to pre-process raw measurements to reduce measurement errors.

12. The method of claim 11, wherein the using the pre-processing technique comprises one or more of selecting pairs of input vectors using backtracking such that the pairs of input vectors allow an output of one or more of the sequential element devices to change, selecting the set of equations based on a number of variables in the set of equations, or selecting an input-output sequential element device pair, wherein the selected input-output sequential element device pair includes a selected one of the sequential element devices of the IC and another selected one of the sequential element devices of the IC with a substantially longest delay path between the selected sequential element devices.

13. An apparatus for characterizing signal propagation delay characteristics associated with a plurality of devices in an integrated circuit (IC) having a plurality of sequential element devices, combinatorial devices and interconnects interconnecting the sequential element devices and the combinatorial devices, the apparatus comprising:
    a processor; and
    a computer-readable storage medium coupled to the processor and having stored therein a plurality of programming instructions configured to be executed by the processor, wherein when executed by the processor, cause the apparatus to:
    receive a specification that identifies the devices in the IC;
    form a plurality of groupings of the devices using the specification, wherein each grouping of the devices is associated with one of a plurality of sensitizable signal paths in the IC associated with a set of equations, wherein each sensitizable signal path comprises one or more interconnected sequential element devices form one or more clusters of the devices to increase accuracy of a solution of the set of equations associated with the sensitizable signal paths;

receive measurements of signal propagation delays responsive to two consecutive inputs applied to the sequential element devices of the IC associated with the sensitizable signal paths; and solve the set of equations to determine the signal propagation delay characteristics of the devices based at least in part on the received measurements.

14. The apparatus of claim 13, wherein the programming instructions are configured to cause the apparatus, when executed, to form the groupings of the devices, using transitive fan-ins of one or more output terminals of the combinatorial devices 15. The apparatus of claims 13, wherein the programming instructions are configured to cause the apparatus, when executed, to associate combinatorial devices that are physically close to one another to form a cluster.

16. The apparatus of claim 13, wherein the programming instructions configured to cause the apparatus, when executed, to form the clusters of the devices, are further configured to cause the apparatus to use a grid to partition the devices in the IC, wherein a distance of each device in a cluster to an intersection point of the grid is less than a predetermined threshold.

17. The apparatus of claim 13, wherein the programming instructions are further configured to cause the apparatus, when executed, to reduce variables of the set of equations with a pre-processing technique.

18. The apparatus of claim 13, wherein the programming instructions are further configured to cause the apparatus, when executed, to perform processing on raw measurements to reduce measurement errors.

19. The apparatus of claim 18, wherein the programming instructions are further configured to cause the apparatus, when executed, to establish an interval of confidence to post-process device characteristics.

20. An article of manufacture for characterizing timing characteristics associated with a plurality of devices in an integrated circuit (IC) having a plurality of sequential element devices, combinatorial devices and interconnects interconnecting the sequential element devices and the combinatorial devices, the article of manufacture comprising:

a non-transitory tangible computer-readable medium; and a plurality of computer-executable instructions stored on the non-transitory tangible computer-readable medium, wherein the computer-executable instructions, when executed by a processor of an apparatus, cause the apparatus to perform a method including:

applying consecutively two input vectors to sequential element devices associated with a plurality of sensitizable signal paths of the IC, using a tester device, wherein the sensitizable signal paths are associated with a set of equations, and each of the sensitizable signal paths comprises interconnected sequential element devices with at least one of the sensitizable signal paths having a cluster of the devices, wherein the devices are clustered to increase accuracy of a solution of the set of equations associated with the sensitizable signal paths;

measuring timing of responses of the sensitizable signal paths; and determining the timing characteristics of the devices by solving the set of equations using measurements.

21. The article of manufacture of claim 20, wherein the method performed by the apparatus further comprises forming one or more clusters of devices using multiple approximation grids.

22. The article of manufacture of claim 20, wherein the method performed by the apparatus further comprises selecting the set of equations to increase a number of variables that appear in another equal number of equations.

23. The article of manufacture of claim 20, wherein solving the set of equations comprise using compressive sensing techniques.

24. The article of manufacture of claim 20, wherein the measuring timing of responses comprises measuring signal propagation time a plurality of times for statistical processing of variables in the set of equations.

25. The article of manufacture of claim 20, wherein the method performed by the apparatus further comprises selecting an input-output sequential element device pair, wherein the input-output sequential element device pair includes an input sequential element device of the IC and an output sequential element device of the IC with a number of variables less than a predetermined threshold.

26. The article of manufacture of claim 25, wherein the number of variables comprises a number of devices between the input sequential element device and output sequential element device.

27. A method for a computing device to characterize signal propagation delay characteristics associated with a plurality of devices in an integrated circuit (IC) having a plurality of sequential element devices, combinatorial devices and interconnects interconnecting the sequential element devices and the combinatorial devices, the method for the computing device comprising:

forming a set of equations based on a plurality of sensitizable signal paths of the IC for modeling signal propagation delay of the devices in the IC, wherein the sensitizable signal paths comprise one or more interconnected sequential element devices, with at least one of the sensitizable signal paths having a cluster of the devices to improve accuracy of a solution of the set of equations associated with the sensitizable signal paths;

applying a pre-processing technique to further improve the accuracy of the solution of the set of equations; and selecting a plurality of input vectors (IVs) for applying to one or more input sequential element devices of the IC associated with the sensitizable signal paths to produce one or more outputs at one or more output sequential element devices of the IC, wherein the sequential element devices are associated with the sensitizable signal paths, and timing response measurements of sensitizable signal paths are used to solve the set of equations to determine the signal propagation delay characteristics of the devices.

28. The method of claim 27, wherein the forming a set of equations comprises forming a set of equations based on a Hamming distance between the equations.

29. The method of claim 27, wherein the applying a pre-processing technique comprises clustering of the devices of the IC based on physical proximity of the devices in the IC.

30. The method of claim 27, wherein the applying a pre-processing technique comprises modifying the set of equations based on a number of variables in the set of equations.

31. The method of claim 27, further comprising post-processing one or more of delay characteristics of the devices to improve the accuracy.

32. The method of claim 31, wherein the post-processing comprises either applying a learn and test procedure to the one or more delay characteristic of the devices based on a statistical model, or applying a boosting procedure to the one or more delay characteristics of the devices.

* * * * *

UNITED STATES PATENT AND TRADEMARK OFFICE
CERTIFICATE OF CORRECTION

PATENT NO. : 8,176,454 B2
APPLICATION NO. : 12/550119
DATED : May 8, 2012
INVENTOR(S) : Potkonjak It is certified that error appears in the above-identified patent and that said Letters Patent is hereby corrected as shown below:

On the Face Page, in Field (56), under "OTHER PUBLICATIONS", in Column 1, Line 1, delete "Y" and insert -- Y. --, therefor.

In Fig. 9, Sheet 10 of 10, in Box "(915)", in Line 1, delete "CONTROLER" and insert -- CONTROLLER --, therefor.

In Column 2, Line 43, delete "hereof" and insert -- hereof. --, therefor.

In Column 3, Line 12, delete "alias" and insert -- alia, --, therefor.

In Column 3, Line 33, delete "including" and insert -- include --, therefor.

In Column 3, Line 57, delete "including" and insert -- include --, therefor.

In Column 4, Line 14, delete "(SSP)" and insert -- (SSPs) --, therefor.

In Column 4, Line 19, delete "transistive" and insert -- transitive --, therefor.

In Column 6, Line 37, delete "(e.g." and insert -- (e.g., --, therefor.

In Column 6, Line 42, delete "gates 206" and insert -- devices 206 --, therefor.

In Column 7, Line 3, delete "(logic-1" and insert -- (logic-1), as --, therefor.

In Column 8, Line 25, delete "(e.g." and insert -- (e.g., --, therefor.

In Column 11, Line 18, delete "l1-norm ((i.e.," and insert -- l1-norm (i.e., --, therefor.

In Column 11, Lines 27-28, delete "l1 norm" and insert -- l1 norm --, therefor.

Signed and Sealed this
Twentieth Day of November, 2012

David J. Kappos
*Director of the United States Patent and Trademark Office*

CERTIFICATE OF CORRECTION (continued)
U.S. Pat. No. 8,176,454 B2

In Column 12, Line 30, delete "R,." and insert -- R, --, therefor.

In Column 13, Line 13, delete "(e.g." and insert -- (e.g., --, therefor.

In Column 17, Line 31, delete "thereof" and insert -- thereof. --, therefor.

In Column 20, Line 27, delete "920" and insert -- 920. --, therefor.

In Column 20, Line 31, delete "thereof" and insert -- thereof. --, therefor.

In Column 20, Line 37, delete "thereof" and insert -- thereof. --, therefor.

In Column 20, Line 44, delete "thereof" and insert -- thereof. --, therefor.

In Column 21, Line 5, delete "thereof" and insert -- thereof. --, therefor.

In Column 21, Line 8, delete "(HDD)," and insert -- (HDDs), --, therefor.

In Column 21, Line 10, delete "(SSD)," and insert -- (SSDs), --, therefor.

In Column 21, Line 21, delete "(DVD)," and insert -- (DVDs), --, therefor.

In Column 23, Line 29, delete "thereof" and insert -- thereof. --, therefor.

In Column 25, Line 44, in Claim 1, delete "Forming" and insert -- forming --, therefor.

In Column 27, Line 2, in Claim 13, delete "devices" and insert -- devices; --, therefor.